US008026187B2

(12) United States Patent
Kabe et al.

(10) Patent No.: US 8,026,187 B2
(45) Date of Patent: Sep. 27, 2011

(54) METHOD OF FORMING SILICON OXIDE FILM AND METHOD OF PRODUCTION OF SEMICONDUCTOR MEMORY DEVICE USING THIS METHOD

(75) Inventors: Yoshiro Kabe, Amagasaki (JP); Junichi Kitagawa, Amagasaki (JP); Kikuo Yamabe, Tsukuba (JP)

(73) Assignees: Tokyo Electron Limited, Tokyo (JP); University of Tsukuba, Tsukuba-shi (JP)

( * ) Notice: Subject to any disclaimer, the term of this patent is extended or adjusted under 35 U.S.C. 154(b) by 56 days.

(21) Appl. No.: 12/550,788

(22) Filed: Aug. 31, 2009

(65) Prior Publication Data
US 2010/0184267 A1 Jul. 22, 2010

(30) Foreign Application Priority Data

Jan. 21, 2009 (JP) ................. 2009-011027

(51) Int. Cl.
*H01L 21/00* (2006.01)
*H01L 21/76* (2006.01)
(52) U.S. Cl. ............... 438/795; 438/400; 438/771
(58) Field of Classification Search .......... 438/795, 438/798, 765, 787, 778
See application file for complete search history.

(56) References Cited

U.S. PATENT DOCUMENTS

| | | | |
|---|---|---|---|
| 6,461,984 B1 * | 10/2002 | Han et al. | 438/788 |
| 6,830,652 B1 | 12/2004 | Ohmi et al. | |
| 7,910,493 B2 * | 3/2011 | Kitagawa et al. | 438/769 |
| 2004/0048452 A1 | 3/2004 | Sugawara et al. | |
| 2005/0255711 A1 | 11/2005 | Sugawara et al. | |
| 2006/0199398 A1 | 9/2006 | Sugawara et al. | |
| 2007/0026655 A1 * | 2/2007 | Kim et al. | 438/594 |

FOREIGN PATENT DOCUMENTS

| | | |
|---|---|---|
| JP | 2004-356528 | 12/2004 |
| JP | 2006-156995 | 6/2006 |
| JP | 2007-201507 | 8/2007 |
| WO | WO 00/74127 A1 | 12/2000 |
| WO | WO 02/059956 A1 | 8/2002 |
| WO | WO 03/088341 A1 | 10/2003 |

OTHER PUBLICATIONS

Z. Lu. et al. "The rate of degradation of thin $SiO_2$ films under application of high electric stress", Inst. of Applied Physics. Univ. of Tsukuba, 123, 2008, 2 pages.

* cited by examiner

*Primary Examiner* — Kevin M Picardat
*Assistant Examiner* — Neil Prasad
(74) *Attorney, Agent, or Firm* — Oblon, Spivak, McClelland, Maier & Neustadt, L.L.P.

(57) ABSTRACT

To form a good quality silicon oxide film provided with both a superior Qbd characteristic and Rd characteristic, a wafer W is loaded into a plasma treatment apparatus where the surface of a silicon layer 501 of the wafer W is treated by plasma oxidation to form on the silicon layer 501 to a film thickness T1 a silicon oxide film 503. Next, the wafer W on which the silicon oxide film 503 is formed is transferred to a thermal oxidation treatment apparatus where the silicon oxide film 503 is treated by thermal oxidation to thereby form a silicon oxide film 505 having a target film thickness T2.

19 Claims, 14 Drawing Sheets

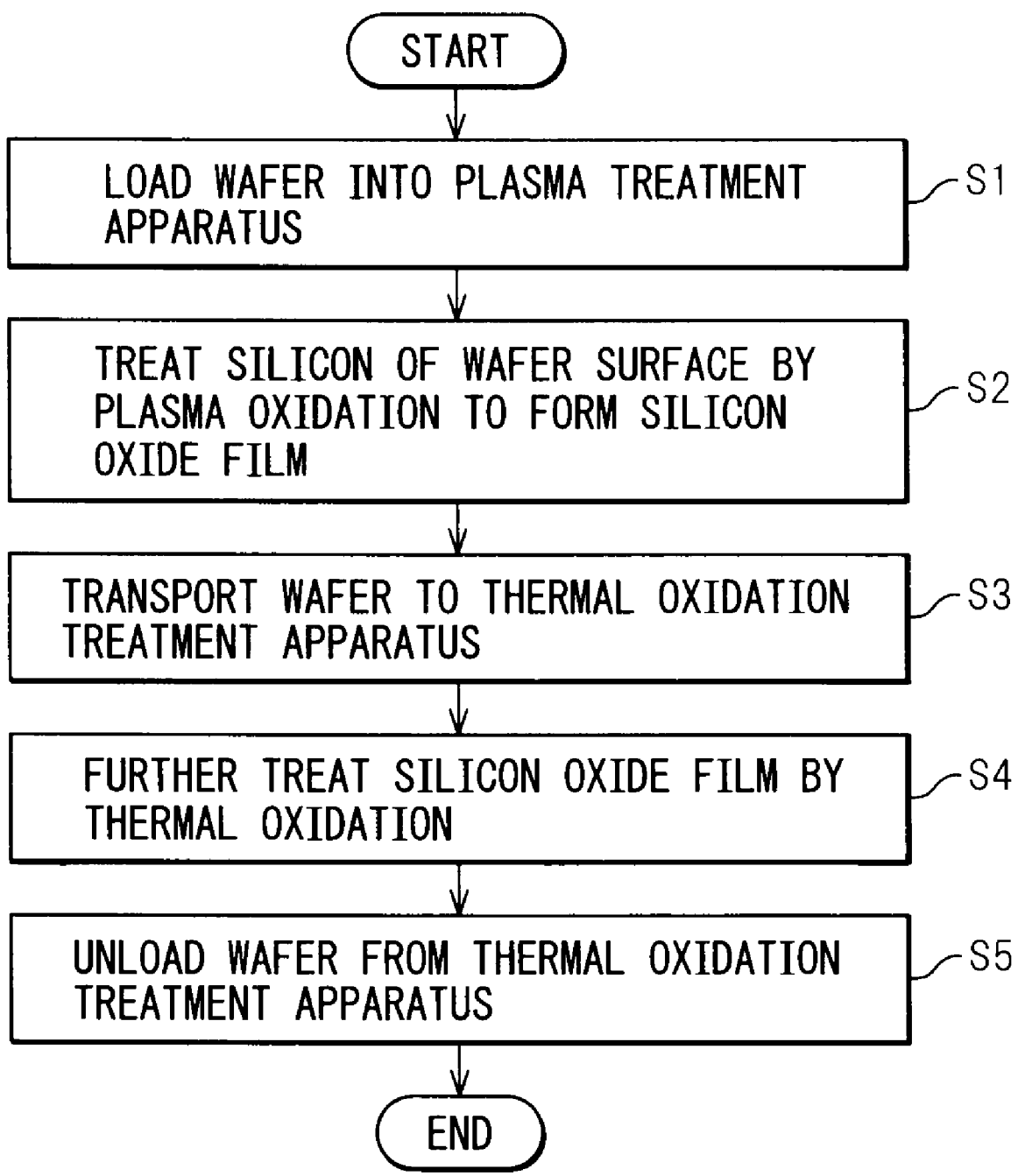

METHOD OF FORMING SILICON OXIDE FILM AND METHOD OF PRODUCTION OF SEMICONDUCTOR MEMORY DEVICE USING THIS METHOD

CROSS-REFERENCE TO RELATED APPLICATION

This application claims priority of Japanese Patent Application No. 2009-011027, filed on Jan. 21, 2009.

BACKGROUND OF THE INVENTION

The present invention relates to a method of forming a silicon oxide film, a method of production of a semiconductor memory device, and a computer readable storage medium.

One type of semiconductor device, a flash memory, has a small size of cells and can be made large in capacity and is also superior in shock resistance, so has been rapidly growing in demand in recent years. As a typical system used in a flash memory, it is known to form an ONO (oxide-nitride-oxide) structure insulating film between a control gate electrode and a floating electrode and inject electrons to the floating gate electrode paired with the control gate electrode or remove them so as to write and erase data.

Further, among flash memories, ones having a multilayer structure called the SONOS (silicon-oxide-nitride-oxide-silicon) type or the MONOS (metal-oxide-nitride-oxide-silicon) type are known. In these types of flash memories, a silicon nitride film (nitride) sandwiched between the silicon dioxide films (silicon-oxide) holds information as a charge storage layer. That is, voltage is applied between a semiconductor substrate (silicon) and a control gate electrode (silicon or metal) to inject electrons into the silicon nitride film of the charge trapping layer to store data or to remove electrons stored at the silicon nitride film to erase data.

A flash memory has superior characteristics as a storage medium as explained above, but there is the problem that there are limits to the number of times data can be written. The tunnel oxide film of a flash memory has to maintain its insulating ability over a long period in order to hold charges injected into the charge storage layer (the above floating gate electrode or silicon nitride film etc.) However, if repeating a data write operation or erase operation applying voltage to run electrons through the tunnel oxide film hundreds of thousands of times, the tunnel oxide film will deteriorate and leakage current will increase (SILC: Stress Induced Leakage Current) and therefore the function as an insulating film will drop. Such deterioration of the tunnel oxide film has become a factor limiting the product lifetime of flash memories and lowering reliability.

A tunnel oxide film usually is a silicon dioxide film formed by oxidation of the surface of silicon. As a method of oxidizing silicon, in general thermal oxidation using a WVG (water vapor generator), thermal radical oxidation such as ISSG (in-situ water vapor generation), and other thermal oxidation and plasma oxidation utilizing plasma for oxidation are known, but in the case of a tunnel oxide film, for the purpose of giving a flash memory high reliability, a high quality insulating film of a thermal oxide film (including thermal radical oxide film) is being used. A thermal oxide film is formed by thermal oxidation of the silicon surface at high temperature such as usually 800° C. or more than 800° C. However, even if using a thermal oxide film, the tunnel oxide film continues to degrade when repeating a data write operation or erase operation, so improvement has been sought.

Japanese Patent Publication (JPA) No. 2004-356528 proposes the method of improving the insulation performance of a gate insulating film to reduce the leakage current by treating the insulating film for improvement by oxygen plasma, then treating it for improvement by thermal annealing. However, JPA 2004-356528 covers improvement of an insulating film formed by CVD. In general, compared with a silicon oxide film obtained by CVD, a thermal oxide film obtained by thermal oxidation of silicon is dense and extremely high in quality, so almost no attention has been paid up to now to further improving the performance of a thermal oxide film.

As indicators of the reliability of an insulating film, two parameters obtained from the TDDB (time dependent dielectric breakdown) are known. One is the Qbd characteristic expressing the total charge until dielectric breakdown when giving electrical stress to an insulating film, while the other is the Rd characteristic expressing the amount of voltage shift with respect to the electrical stress (degradation speed) (refer to Z. Lu et al., IWDTF, 123 (2008).) In evaluating the reliability of the tunnel oxide film of a flash memory as well, it is believed necessary to consider said two parameters.

SUMMARY OF THE INVENTION

The inventors evaluated the reliability of the silicon oxide film used as a tunnel oxide film based on the above two parameters. As a result, as shown in the later explained examples, they noticed that for the Rd characteristic, a thermal oxide film is more superior than a plasma oxide film, while for the Qbd characteristic, a plasma oxide film is more superior than a thermal oxide film. That is, in a thermal oxide film and a plasma oxide film, the Qbd characteristic and the Rd characteristic are in a tradeoff relationship, but the inventors came out with the idea that if it were possible to form a silicon oxide film achieving both a good Qbd characteristic and Rd characteristic, it would be possible to further enhance the reliability of the flash memory when used as a tunnel oxide film.

Therefore, an object of the present invention is to provide a method of forming a good quality silicon oxide film provided with both a superior Qbd characteristic and Rd characteristic and thereby provide a semiconductor device high in reliability.

To solve the above problem, a method of forming a silicon oxide film according to a first aspect of the present invention is provided with a first oxidation treatment step of treating silicon exposed at a surface of a treated object by plasma oxidation to form a silicon oxide film and a second oxidation treatment step of further treating said silicon oxide film by thermal oxidation.

In the method of forming a silicon oxide film of the present invention, preferably the first oxidation treatment step has a treatment pressure of 6.7 Pa to 267 Pa in range.

Further, in the method of forming a silicon oxide film of the present invention, preferably the first oxidation treatment step generates plasma by a treatment gas containing a rare gas, oxygen gas, and hydrogen gas and has a flow rate ratio of the oxygen gas to a total flow rate of the treatment gas of 0.2% to 10% in range.

Further, in the method of forming a silicon oxide film of the present invention, preferably the first oxidation treatment step has a treatment temperature of 200° C. to 600° C. in range.

Further, in the method of forming a silicon oxide film of the present invention, preferably the silicon oxide film formed has a target film thickness of 4 nm to 10 nm in range and the first oxidation treatment step forms a silicon oxide film by a film thickness of 70% to 98% of the target film thickness in range and the second oxidation treatment step increases the film until reaching the target film thickness.

Further, in the method of forming a silicon oxide film of the present invention, preferably the first oxidation treatment step is performed in a plasma treatment apparatus using a planar antenna having a plurality of holes to introduce microwaves into a treatment vessel and generate plasma of the treatment gas.

Further, in the method of forming a silicon oxide film of the present invention, preferably the second oxidation treatment step is performed by heating in an oxidizing atmosphere to a temperature of 800° C. to 1100° C. in range.

Further, in the method of forming a silicon oxide film of the present invention, in the second oxidation treatment step, wet thermal oxidation is preferably performed.

Further, in the method of forming a silicon oxide film of the present invention, preferably the silicon oxide film is a tunnel oxide film of a semiconductor memory device.

Further, in the method of forming a silicon oxide film of the present invention, preferably the silicon oxide film is an insulating film for insulating between a floating gate electrode and control gate electrode in a semiconductor memory device.

Further, in the method of forming a silicon oxide film of the present invention, preferably the silicon oxide film is a device isolation film defining a device region of a semiconductor device.

A method of production of a semiconductor memory device according to a second aspect of the present invention is a method of production of a semiconductor memory device comprised of a silicon layer on which a charge storage layer and a gate electrode are formed via a tunnel oxide film, comprising forming the tunnel oxide film by a method of forming a silicon oxide film of the first aspect.

A computer readable storage medium of a third aspect of the present invention is a computer readable storage medium in which a control program operating on a computer is stored, the control program making the computer control the processing system so that, when run, a processing system having a plurality of treatment chambers for performing predetermined treatment on the treated object performs a method of forming a silicon oxide film including a first step of treating silicon exposed at a surface of the treated object by plasma oxidation to form a silicon oxide film and a second step of treating the silicon oxide film in an oxidizing atmosphere by thermal oxidation.

According to the method of forming a silicon oxide film of the present invention, by treating silicon by plasma oxidation to form a silicon oxide film, then further treating it by thermal oxidation, a good quality silicon oxide film provided with both a superior Qbd characteristic and Rd characteristic can be formed. The silicon oxide film formed by the method of the present invention has few impurities or dangling bonds or other defects and can be effectively utilized for applications where electrical stress is repeatedly applied.

BRIEF DESCRIPTION OF THE DRAWINGS

FIG. 6 is a flow chart showing the general procedure of a method of forming a silicon oxide film according to an embodiment of the present invention.

DESCRIPTION OF THE PREFERRED EMBODIMENTS

First Embodiment

Figure 1:
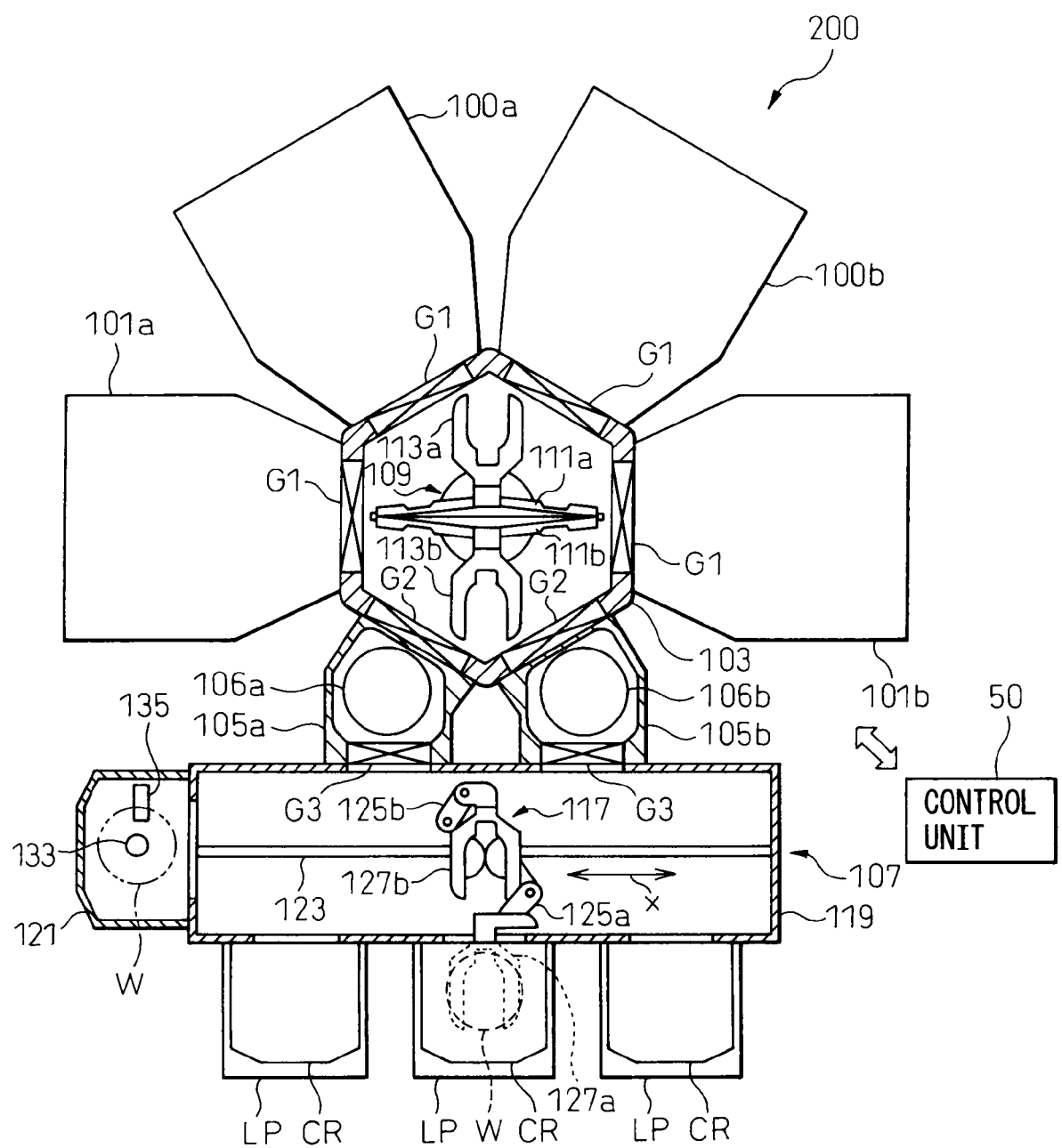
FIG. 1 is a plan view showing the general configuration of a substrate processing system.

Below, embodiments of the present invention will be explained in detail with reference to the drawings. First, while referring to FIG. 1, a substrate processing system using the method of forming an insulating film according to an embodiment of the present invention will be explained. FIG. 1 is a view of the general configuration showing a substrate processing system 200 designed for example to treat as a substrate a semiconductor wafer (below, simply called a "wafer") W by for example plasma oxidation and thermal oxidation. This substrate processing system 200 is comprised of a multichamber structure cluster tool.

The substrate processing system 200 is provided with, as main components, four process modules 100a, 100b, 101a, and 101b for treating the wafer W by various types of treatment, a vacuum side transfer chamber 103 connected to these process modules 100a, 100b, 101a, and 101b through gate valves G1, two load lock chambers 105a and 105b connected to this vacuum side transfer chamber 103 through gate valves G2, and a loader unit 107 connected to these two load lock chambers 105a and 105b through gate valves G3.

The four process modules 100a, 100b, 101a, and 101b may treat the wafer W in the same way or may treat it in respectively different ways. In the present embodiment, the process modules 100a and 100b treat the wafer W to oxidize the silicon to form a silicon oxide film in plasma oxidation, while the process modules 101a and 101b further treat the silicon oxide film formed by plasma oxidation by thermal oxidation.

The vacuum side transfer chamber 103, designed to be able to be evacuated, is provided with a transfer apparatus 109 as a first substrate transfer apparatus for transferring the wafer W at the process modules 100a, 100b, 101a, 101b and load lock chambers 105a and 105b. This transfer apparatus 109 has a pair of transfer arms 111a and 111b arranged so as to face each other. The transfer arms 111a and 111b are designed to be able to extend and turn about the same axes. Further, the transfer arms 111a and 111b are provided at their front ends with forks 113a and 113b for carrying and holding wafers W. The transfer apparatus 109 carries wafers W on these forks 113a and 113b and, in that state, conveys the wafers W among the process modules 100a, 100b, 101a, and 101b or between the process modules 100a, 100b, 101a, and 101b and the load lock chambers 105a and 105b.

Inside the load lock chambers 105a and 105b, carrying tables 106a and 106b for carrying wafers W are provided. The load lock chambers 105a and 105b are designed to be able to switch between a vacuum state and a state open to the atmosphere. Through the carrying tables 106a and 106b of the load lock chambers 105a and 105b, wafers W are transferred between the vacuum side transfer chamber 103 and the atmosphere side transfer chamber 119 (explained later).

The loader unit 107 has an atmosphere side transfer chamber 119 provided with a transfer apparatus 117 as a second substrate transfer apparatus for conveying a wafer W, three load ports LP provided adjoining each other at this atmosphere side transfer chamber 119, and an orienter 121 as a position measuring device provided adjoining another side surface of the atmosphere side transfer chamber 119 and measuring the position of wafers W.

The atmosphere side transfer chamber 119 is for example provided with a circulating apparatus (not shown) for down flow of nitrogen gas or clean air so as to maintain a clean environment. The atmosphere side transfer chamber 119 has a rectangular shape seen from a plan view and is provided with a guide rail 123 along its longitudinal direction. This guide rail 123 supports the transfer apparatus 117 in a slidable manner. That is, the transfer apparatus 117 is designed to be able to be moved by a not shown drive mechanism along the guide rail 123 in the X-direction. This transfer apparatus 117 has a pair of transfer arms 125a and 125b arranged above and below each other. The transfer arms 125a and 125b are designed to extend and turn. The transfer arms 125a and 125b are provided at their front ends with forks 127a and 127b as holding members for carrying and holding wafers W. The transfer apparatus 117 carries wafers W on these forks 127a and 127b and in that state conveys wafers W between the wafer cassettes CR at the load ports LP and the load lock chambers 105a and 105b and orienter 121.

The load ports LP are designed to be able to carry wafer cassettes CR. The wafer cassettes CR are designed to be able to carry and store pluralities of wafers W at the same intervals in multiple levels.

The orienter 121 is provided with a rotating disk 133 rotated by a not shown drive motor and an optical sensor 135 provided on this rotating disk 133 at an outer circumference position and detecting an edge part of a wafer W.

A substrate processing system 200 having such a configuration uses the following procedure to treat a wafer W by plasma oxidation, CVD, and plasma modification. First, it uses either of the forks 127a and 127b of the transfer apparatus 117 of the atmosphere side transfer chamber 119 to take out a single wafer W from a wafer cassette CR at a load port LP, positions it by the orienter 121, then loads it in the load lock chamber 105a (or 105b). In the state with the wafer W carried on the carrying table 106a (or 106b) at the load lock chamber 105a (or 105b), the gate valve G3 is closed and the inside is evacuated to a vacuum state. After this, the gate valve G2 is opened and the fork 113a or 113b of the transfer apparatus 109 in the vacuum side transfer chamber 103 is used to carry the wafer W out from the load lock chamber 105a (or 105b).

The wafer W carried out by the transfer apparatus 109 from the load lock chamber 105a (or 105b) is first loaded into either of the process modules 100a or 100b, the gate valve G1 is closed, then the wafer W is treated by plasma oxidation.

Next, the gate valve G1 is opened, and the wafer W on which a silicon oxide film is formed is unloaded by the transfer apparatus 109 from the process module 100a (or 100b) in the vacuum state to either of the process modules 101a or 101b. Further, the gate valve G1 is closed, then the wafer W is treated by thermal oxidation.

Next, the gate valve G1 is opened, the wafer W on which the silicon oxide film is formed is unloaded by the transfer apparatus 109 from the process module 101a (or 101b) in the vacuum state, then it is loaded in the load lock chamber 105a (or 105b). Further, a procedure reverse to the above is then used to store the treated wafer W in the wafer cassette CR at the load port LP whereby the treatment of the wafer W at the substrate processing system 200 is completed. Note that the treatment apparatuses in the substrate processing system 200 may be laid out in any way so long as enabling efficient treatment. Further, the number of process modules of the substrate processing system 200 is not limited to four and may be five or more as well.

Figure 2:
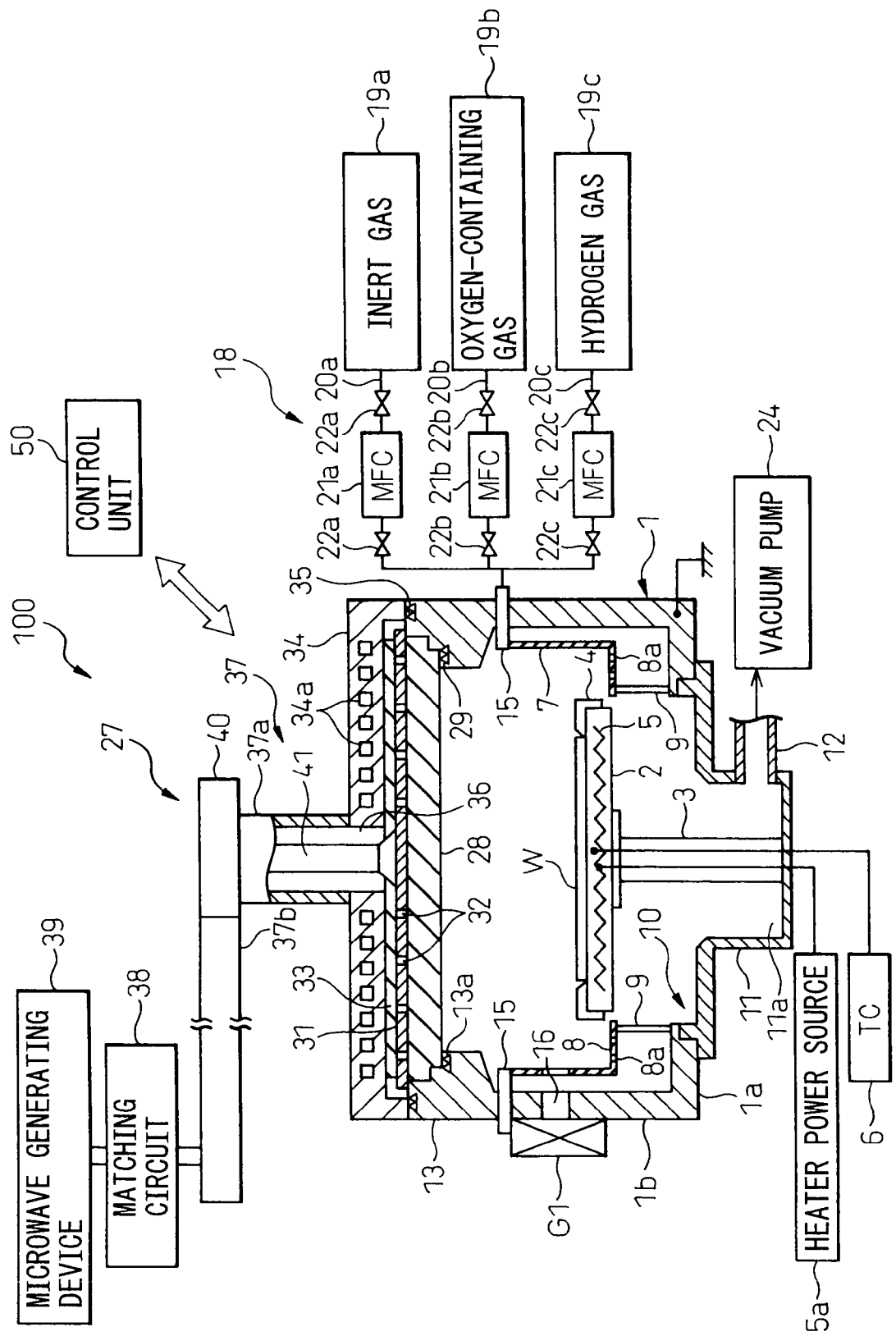
FIG. 2 is a schematic cross-sectional view showing an example of a plasma treatment apparatus suitable for working the method of the present invention.
Figure 3:
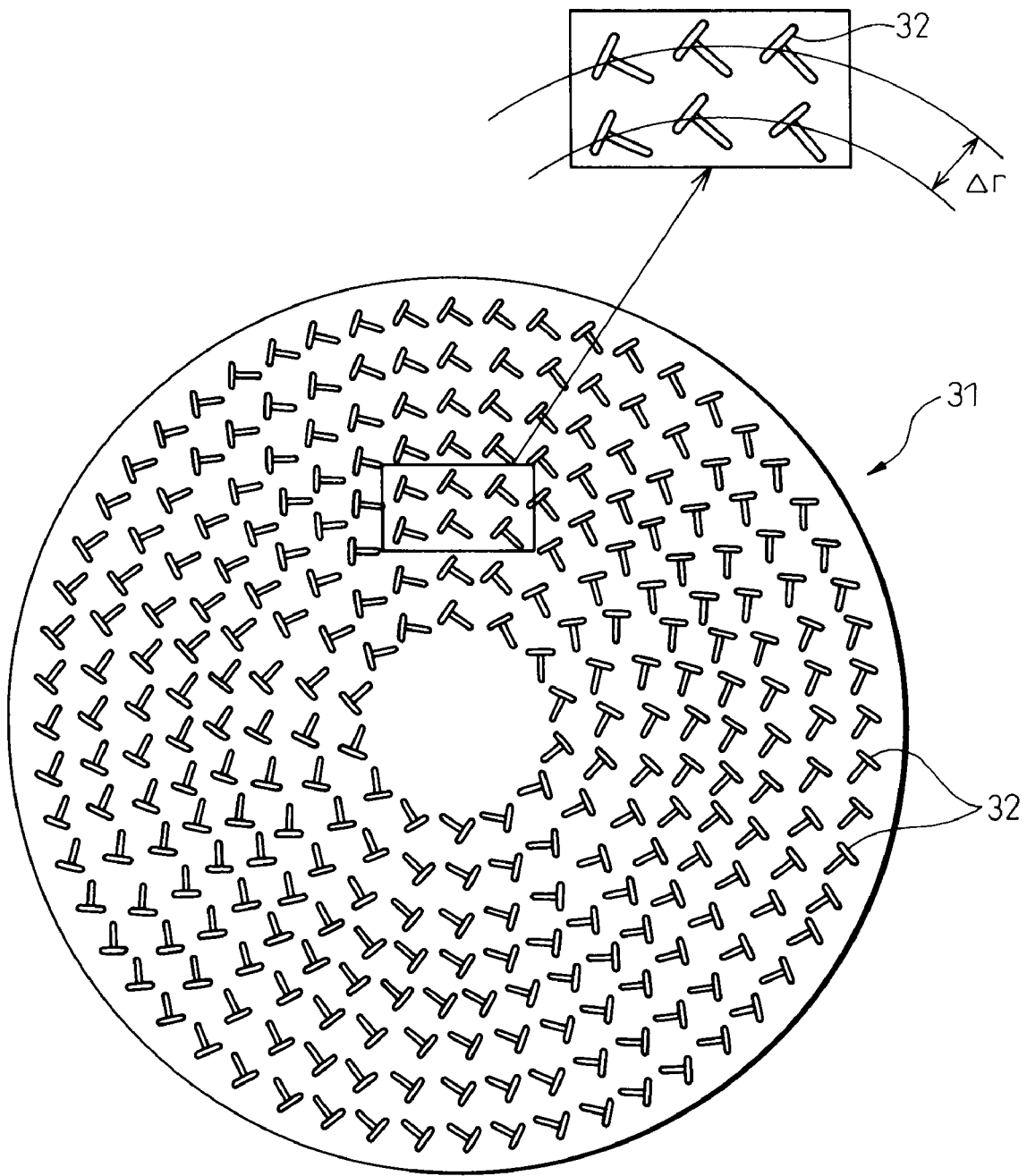
FIG. 3 is a view of the structure of a planar antenna.

FIG. 2 is a cross-sectional view schematically showing the general configuration of a plasma treatment apparatus 100 forming the process modules 100a and 100b. Further, FIG. 3 is a plan view showing a planar antenna of the plasma treatment apparatus 100 of FIG. 2.

The plasma treatment apparatus 100 is configured as an RLSA (Radial Line Slot Antenna) microwave plasma treatment apparatus which uses a planar antenna having a plurality of slot shaped holes, in particular an RLSA, to introduce microwaves into a treatment vessel and thereby generate high density and low electron temperature microwave excited plasma. The plasma treatment apparatus 100 can perform treatment by plasma at a plasma density of $1\times10^{10}$ to $5\times10^{12}/$cm$^3$ and a 0.7 to 2 eV low electron temperature. Therefore, plasma treatment apparatus 100 can be suitably utilized for the purpose of oxidizing silicon to form a silicon oxide film ($SiO_2$ film) in the process of production of various types of semiconductor devices.

The plasma treatment apparatus 100 is provided with, as main components, an air-tightly configured treatment vessel 1, a gas feed device 18 feeding gas into the treatment vessel 1, an exhaust mechanism provided with a vacuum pump 24 for evacuating the inside of the treatment vessel 1, a microwave introduction mechanism 27 provided above the treatment vessel 1 and introducing microwaves into the treatment vessel 1, and a control unit 50 controlling these components of the plasma treatment apparatus 100.

The treatment vessel 1 is formed from a grounded substantially cylindrically shaped vessel. Note that, the treatment vessel 1 may also be an angular cylindrical shape vessel. The treatment vessel 1 has a floor 1a and side walls 1b made of aluminum or another metal or alloy.

Inside the treatment vessel 1, a carrying table 2 for supporting the treated object, that is, the wafer W, horizontally is provided. The carrying table 2 is made from a material having a high heat conductivity, for example, AlN or another ceramic. This carrying table 2 is supported by a cylindrically shaped support member 3 extending upward from the center of the floor of the exhaust chamber 11. The support member 3 is made of for example AlN or another ceramic.

Further, the carrying table 2 is provided with a covering 4 covering the outer rim and guiding the wafer W. This covering 4 is for example a ring-shaped member made of quartz, AlN, $Al_2O_3$, SiN, or another material.

Further, the carrying table 2 has as a temperature regulating mechanism a resistance heating type heater 5 embedded in it. This heater 5 is fed power from a heater power source 5a to heat the carrying table 2 and that heat is used to uniformly heat the treated substrate, that is, the wafer W.

Further, the carrying table 2 is provided with a thermocouple (TC) 6. This thermocouple 6 measures the carrying table 2 for temperature thereby enabling the wafer W to be controlled in heating temperature from for example room temperature to 900° C. in range.

Further, the carrying table 2 is provided with wafer support pins (not shown) for supporting and lifting the wafer W. The wafer support pins are provided to be able to stick out from and retract into the surface of the carrying table 2.

The treatment vessel 1 is provided at its inner circumference with a quartz cylindrically shaped liner 7. Further, the carrying table 2 is provided at its outer circumference side with a ring configuration of quartz baffle plates 8 having a large number of exhaust holes 8a for uniformly evacuating the treatment vessel 1. These baffle plates 8 are supported by a plurality of support columns 9.

At the approximate center of a floor 1a of the treatment vessel 1, a circular opening 10 is formed. The floor 1a is provided with an exhaust chamber 11 communicating with this opening 10 and sticking out downward. This exhaust chamber 11 is connected with an exhaust pipe 12. Through this exhaust pipe 12, it is connected to a vacuum pump 24.

Above the treatment vessel 1, a ring-shaped lid frame 13 opened at its center is joined. At the inner circumference of the opening, a ring-shaped support part 13a is formed sticking out to the inside (space inside treatment vessel).

At the side wall 1b of the treatment vessel 1, a ring shaped gas introduction part 15 is provided. This gas introduction part 15 is connected to a gas feed device 18 feeding an oxygen-containing gas or plasma excitation gas. Note that the gas introduction part 15 may be provided in a nozzle shape or shower head shape.

Further, at the side wall 1b of the treatment vessel 1, a loading/unloading port 16 for loading and unloading wafers W between the plasma treatment apparatus 100 and the adjoining transfer chamber 103 and a gate valve G1 for opening and closing this loading/unloading port 16 are provided.

The gas feed device 18 has gas feed sources (for example, an inert gas feed source 19a, oxygen-containing gas feed source 19b, and hydrogen gas feed source 19c), piping (for example, gas lines 20a, 20b, and 20c), flow rate control devices (for example, mass flow controllers 21a, 21b, and 21c), and valves (for example, shutoff valves 22a, 22b, and 22c). Note that the gas feed device 18 may also have as other not shown gas feed sources for example a purge gas feed source used when replacing the atmosphere in the treatment vessel 1 etc.

As the inert gas, for example, $N_2$ gas, a rare gas, etc. may be used. As the rare gas, for example, Ar gas, Kr gas, Xe gas, He gas, etc. may be used. Among these as well, from the viewpoint of superior economy, use of Ar gas is particularly preferred. Further, as the oxygen-containing gas, for example, oxygen gas ($O_2$), water vapor ($H_2O$), nitrous oxide (NO), nitrous oxide ($N_2O$), etc. may be used.

The inert gas, oxygen-containing gas, and hydrogen gas are introduced from the inert gas feed source 19a, oxygen-containing gas feed source 19b, and hydrogen gas feed source 19c of the gas feed device 18 through the respective gas lines 20a, 20b, and 20c to reach the gas introduction part 15 and are introduced from the gas introduction part 15 to the inside of the treatment vessel 1. Note that, hydrogen gas is fed if necessary. The gas lines 20a, 20b, and 20c connected to the gas feed sources are provided with mass flow controllers 21a, 21b, and 21c and sets of shutoff valves 22a, 22b, and 22c around them. By this configuration of a gas feed device 18, it becomes possible to switch the gas fed or control the flow rate etc.

The exhaust mechanism is provided with a vacuum pump 24 and not shown piping. The vacuum pump 24 is for example provided with a turbomolecular pump or other high speed vacuum pump etc. In the above way, the vacuum pump 24 is connected through the exhaust pipe 12 to the exhaust chamber 11 of the treatment vessel 1. The gas in the treatment vessel 1 uniformly flows into the space 11a of the exhaust chamber 11 and further is exhausted from the space 11a by operation of the vacuum pump 24 through the exhaust pipe 12 to the outside. Due to this, the inside of the treatment vessel 1 can be reduced in pressure to a predetermined vacuum degree, for example, 0.133 Pa, at a high speed.

Next, the configuration of the microwave introduction mechanism 27 will be explained. The microwave introduction mechanism 27 is provided with, as main components, a transmission plate 28, planar antenna 31, slow wave material 33, cover member 34, waveguide 37, matching circuit 38, and microwave generating device 39.

The transmission plate 28 for passing the microwaves is provided on the support part 13a sticking out to the inner circumference side in the lid frame 13. The transmission plate 28 is made from a dielectric material, for example, quartz or $Al_2O_3$, AlN, or another ceramic. The space between this transmission plate 28 and support part 13a is sealed air-tightly through a seal member 29. Therefore, the inside of the treatment vessel 1 is held air tight.

The planar antenna 31 is provided above the transmission plate 28 so as to face the carrying table 2. The planar antenna 31 is formed as a disk in shape. Note that, the planar antenna 31 is not limited in shape to a disk and may also for example be a square plate. This planar antenna 31 is fastened to the top end of the lid frame 13.

The planar antenna 31 is for example comprised of a copper plate or aluminum plate with a surface plated by gold or silver. The planar antenna 31 has a large number of slot-shaped microwave radiation holes 32 radiating the microwaves. The microwave radiation holes 32 are formed by a predetermined pattern passing through the planar antenna 31.

The individual microwave radiation holes 32, for example, as shown in FIG. 3, form elongated rectangular shapes (slot shapes). Further, typically, adjoining microwave radiation holes 32 are arranged to form "T" shapes. Further, the microwave radiation holes 32 arranged combined to predetermined shapes (for example T-shapes) in this way are arranged overall in concentric circles.

The microwave radiation holes 32 are determined in length and intervals in accordance with the wavelength ($\lambda g$) of the microwaves. For example, the microwave radiation holes 32 are arranged at intervals of $\lambda g/4$ to $\lambda g$. Note that, in FIG. 3, the intervals between adjoining microwave radiation holes 32 formed in concentric circles are shown by $\Delta r$. Note that, the microwave radiation holes 32 may also be circular shapes, arc shapes, and other shapes as well. Further, the layout of the microwave radiation holes 32 is not particularly limited. They may be laid out, in addition to concentric circles, in for example spirals, radiating shapes, etc.

At the top surface of the planar antenna 31, a slow wave material 33 having a dielectric constant larger than vacuum is provided. This slow wave material 33 has the function of shortening the wavelength of the microwaves to adjust the plasma since the wavelength of microwaves becomes longer in a vacuum. As the material of the slow wave material 33, for example, quartz, a polytetrafluoroethylene resin, a polyimide resin, etc. may be used.

Note that, the planar antenna 31 and the transmission plate 28 and, further, the slow wave material 33 and the planar antenna 31 may be either in contact or separated, but contact is preferable.

Above the treatment vessel 1, to cover these planar antenna 31 and slow wave material 33, a cover member 34 is provided. The cover member 34, for example, is formed by an aluminum or stainless steel or other metal material. This cover member 34 and planar antenna 31 form a flat waveguide. The top end of the lid frame 13 and the cover member 34 are sealed by a seal member 35. Further, inside the cover member 34, a cooling water channel 34a is formed. By running cooling water through this cooling water channel 34a, the cover member 34, slow wave material 33, planar antenna 31, and transmission plate 28 can be cooled. Note that, the cover member 34 is grounded.

At the center of the top surface (ceiling) of the cover member 34, an opening 36 is formed. This opening 36 has a waveguide 37 connected to it. The other end of the waveguide 37 has a microwave generating device 39 generating microwaves connected to it through a matching circuit 38.

The waveguide 37 has a coaxial waveguide 37a of a cross-sectional circular shape extending upward from the opening 36 of the cover member 34 and a rectangular waveguide 37b connected to the top end of this coaxial waveguide 37a through a mode converter 40 and extending in the horizontal direction. The mode converter 40 has the function of converting microwaves propagating through the inside of the rectangular waveguide 37b by the TE mode to the TEM mode.

At the center of the coaxial waveguide 37a, an internal conductor 41 extends. This internal conductor 41 is connected and fastened at its bottom end to the center of the planar antenna 31. By such a structure, microwaves are efficiently and uniformly propagated through the internal conductor 41 of the coaxial waveguide 37a in a radial manner to the flat waveguide formed by the cover member 34 and the planar antenna 31, are introduced from the microwave radiation holes (slots) 32 of the planar antenna 31 into the treatment vessel, and generate plasma.

Using the above configured microwave introduction mechanism 27, microwaves generated by the microwave generating device 39 are propagated through the waveguide 7 to the planar antenna 31 and further introduced through the transmission plate 28 to the inside of the treatment vessel 1. Note that, as the frequency of the microwaves, for example 2.45 GHz is preferably used. In addition, 8.35 GHz, 1.98 GHz, etc. may also be used.

Figure 4:
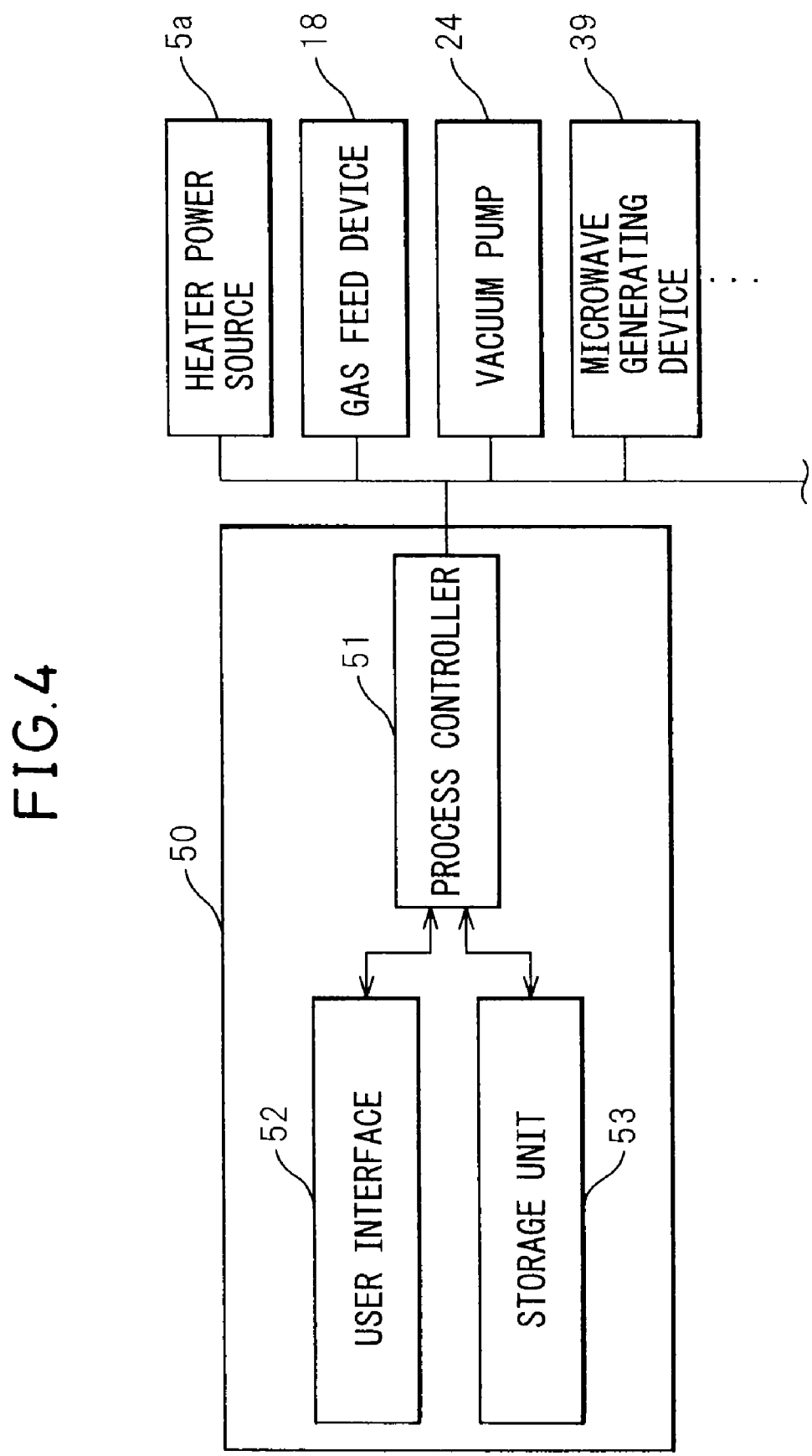
FIG. 4 is an explanatory view showing an example of the configuration of a control unit.

The components of the plasma treatment apparatus 100 are connected to the control unit for control. The control unit 50 has a computer and, for example, as shown in FIG. 4, is provided with a process controller 51 provided with a CPU and a user interface 52 and storage unit 53 connected to this process controller 51. The process controller 51 is a control means for overall control of for example the components relating to the temperature, pressure, gas flow rate, microwave output, and other process conditions (for example, heater power source 5a, gas feed device 18, vacuum pump 24, microwave generating device 39 etc.) in the plasma treatment apparatus 100.

The user interface 52 has a keyboard by which the process manager inputs commands for control of the plasma treatment apparatus 100, a display for displaying the operating state of the plasma treatment apparatus 100 in a visual manner, etc. Further, the storage unit 53 stores "recipes" recording control programs (software) and treatment condition data etc. for realizing various types of treatment performed by the plasma treatment apparatus 100 under the control of the process controller 51.

Further, if necessary, the user interface 52 is used to instruct the callup of any recipe from the storage unit 53 for execution by the process controller 51 so as to perform the desired treatment under the control of the process controller 51 inside the treatment vessel 1 of the plasma treatment apparatus 100. Further, the recipes of the control programs, treatment conditions data, etc. may be stored in a computer readable storage medium, for example, CD-ROM, hard disk, flexible disk, flash memory, DVD, Blueray disk, etc. and used in that state or may be sent from another apparatus through for example a dedicated line as required for utilization on-line.

The thus configured plasma treatment apparatus 100 can treat a base layer etc. by plasma without damage at a 600° C. or less low temperature. Further, the plasma treatment apparatus 100 is superior in uniformity of the plasma, so uniformity of treatment in the plane of the wafer W can be realized even for a large wafer W of for example a 300 mm diameter or more.

Figure 5:
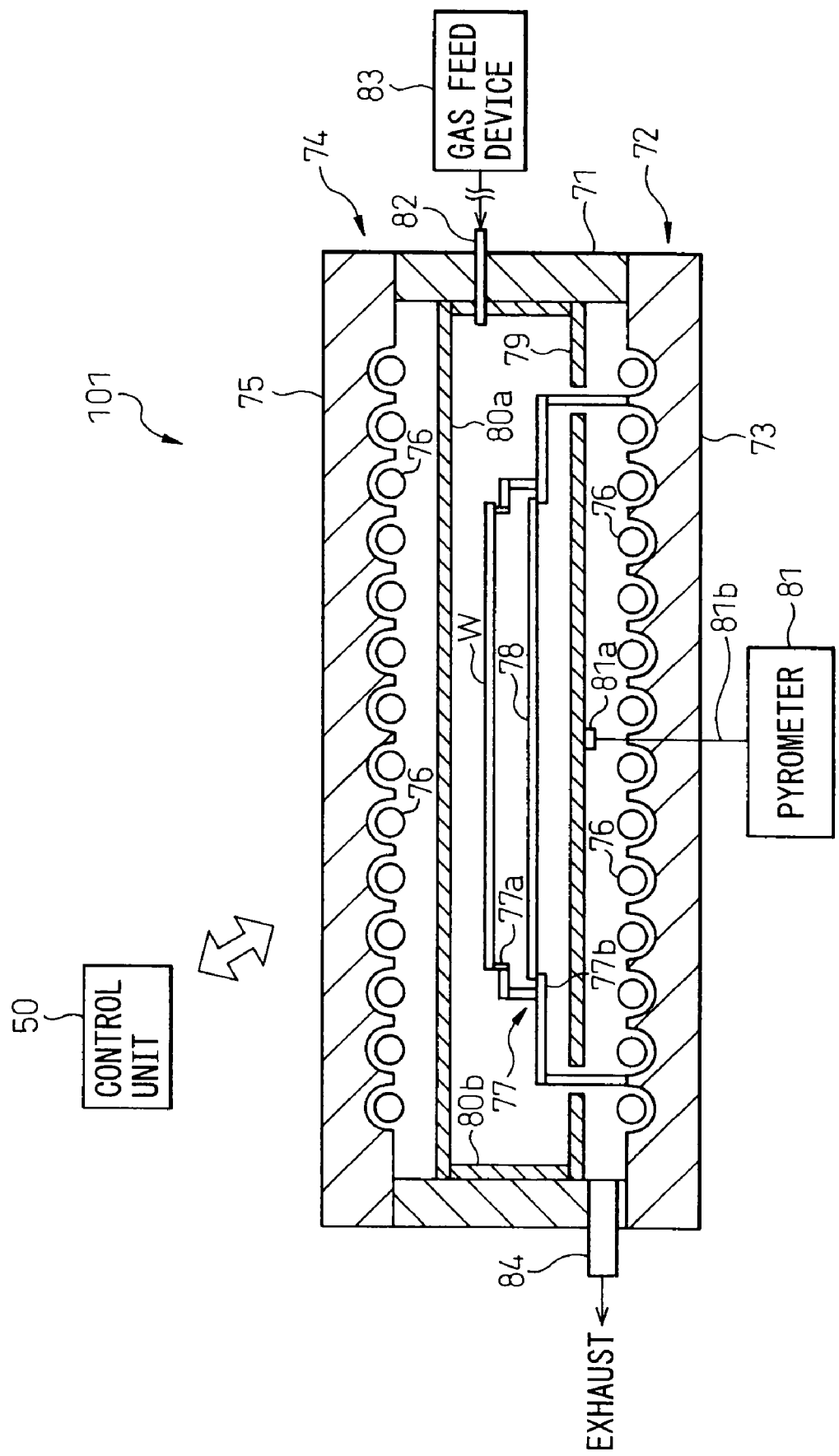
FIG. 5 is a schematic cross-sectional view showing an example of a thermal oxidation treatment apparatus suitable for working the method of the present invention.

FIG. 5 is a cross-sectional view showing the general configuration of a thermal oxidation treatment apparatus forming each of the process modules 101a and 101b. This thermal oxidation treatment apparatus 101 is an apparatus with good controllability enabling heating in a short time and for example can be used as an RTP (rapid thermal process) apparatus able to treat a thin film etc. formed on a wafer W in an oxidizing gas atmosphere at a 800 to 1100° C. or so high temperature region in a short time by thermal oxidation.

In FIG. 5, reference numeral 71 is a cylindrically shaped treatment vessel. Below this treatment vessel 71, a bottom heat emitting unit 72 is detachably provided. Further, above the treatment vessel 71, a top heat emitting unit 74 is detachably provided so as to face the bottom heat emitting unit 72. The bottom heat emitting unit 72 is comprised of a water-cooling jacket 73 on the top surface of which a plurality of tungsten lamps 76 are arranged as heating means. In the same way, the top heat emitting unit 74 has a water-cooling jacket 75 and a plurality of tungsten lamps 76 arranged as heating means at its bottom surface. Note that, the lamps are not limited to tungsten lamps 76 and for example may also be halogen lamps, Xe lamps, mercury lamps, flash lamps, etc. The tungsten lamps 76 provided facing each other in the treatment vessel 71 in this way are connected to not shown power sources. By controlling the rate of power fed from there by the control unit 50, the amount of heat generated can be controlled.

Between the bottom heat emitting unit 72 and the top heat emitting unit 74, a support part 77 for supporting a wafer W is provided. This support part 77 has wafer support pins 77a for supporting a wafer W in a state held in a treatment space in the treatment vessel 71 and a liner attachment part 77a supporting a hot liner 78 for measuring the temperature of the wafer W during treatment. Further, the support part 77 is coupled with a not shown rotation mechanism which rotates the support part 77 as a whole about a vertical axis. Due to this, during treatment, the wafer W rotates by a predetermined speed whereby the heat treatment is made more uniform.

Below the treatment vessel 71, a pyrometer 81 is arranged. During heat treatment, heat rays from the hot liner 78 are measured through a port 81a and optical fiber 81b by the pyrometer 81, whereby it becomes possible to indirectly obtain a grasp of the temperature of the wafer W. Note that, it is also possible to directly measure the temperature of the wafer W.

Further, below the hot liner 78 and between it and the tungsten lamps 76 of the bottom heat emitting unit 72, a quartz member 79 is interposed. As illustrated, the port 81a is provided with this quartz member 79. Note that, a plurality of the ports 81a may also be provided. Further, above the wafer W as well and between it and the tungsten lamps 76 of the top heat emitting unit 74, a quartz member 80a is interposed. Further, so as to surround the wafer W, the inner circumference of the treatment vessel 71 is also provided with a quartz member 80b. Note that, lifter pins (not shown) for supporting and raising the wafer W are provided passing through the hot liner 78 and are used for loading and unloading the wafer W.

Between the bottom heat emitting unit 72 and treatment vessel 71 and between the top heat emitting unit 74 and treatment vessel 71, seal members (not shown) are interposed whereby the inside of the treatment vessel 71 becomes airtight. Further, at the side part of the treatment vessel 71, a gas feed device 83 connected to a gas introduction pipe 82 is provided. A not shown flow rate control device may be used to introduce into the treatment space of the treatment vessel 71 for example $O_2$ gas, NO, $N_2O$, $H_2O$ (generated from $O_2$ and $H_2$ by a water vapor generator), or other oxidizing gas and, if necessary, further a rare gas or other inert gas or $N_2$, $H_2$, etc. Further, at the bottom of the treatment vessel 71, an exhaust pipe 84 is provided. A not shown vacuum pump or other exhaust apparatus may be used to reduce the pressure inside the treatment vessel 71.

The components of the thermal oxidation treatment apparatus 101, like the plasma treatment apparatus 100, are connected to and controlled by the control unit 50. Further, an instruction from the user interface 52 etc. is used to call up any recipe from the storage unit 53 and run it at the process controller 51 so as to make the thermal oxidation treatment apparatus 101 perform thermal oxidation treatment under the control of the process controller 51. For example, by using the process controller 51 to control the power feed rate to the tungsten lamps 76 provided at the bottom heat emitting unit 72 and top heat emitting unit 74, the heating speed and heating temperature of the wafer W can be adjusted. Further, the flow rate and ratio of the oxidizing gas fed from the gas feed device 83 to the inside of the treatment vessel 71 can be adjusted.

Next, the method of forming a silicon oxide film as the tunnel oxide film performed at the substrate processing system 200 will be explained while referring to FIG. 6 and FIGS. 7A to 7D. FIG. 6 is a flow chart showing the flow of the film forming procedure of a silicon oxide film, while FIGS. 7A to 7D are process charts for explaining the main steps.

The method of forming a silicon oxide film of the present embodiment is for example performed by the routine of step S1 to step S5 shown in FIG. 6. First, at step S1 of FIG. 6, a transfer apparatus 109 in a vacuum side transfer chamber 103 is used to load a wafer W for treatment into the plasma treatment apparatus (for example the process module 100a or 100b).

Figure 7A:
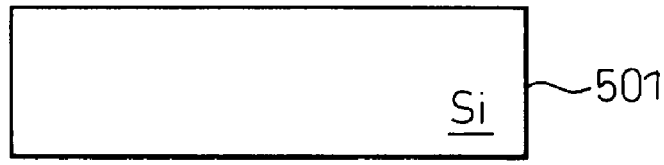
FIGS. 7A to 7D are explanatory views for explaining main steps of the method of forming a silicon oxide film according to an embodiment of the present invention.
Figure 7B:
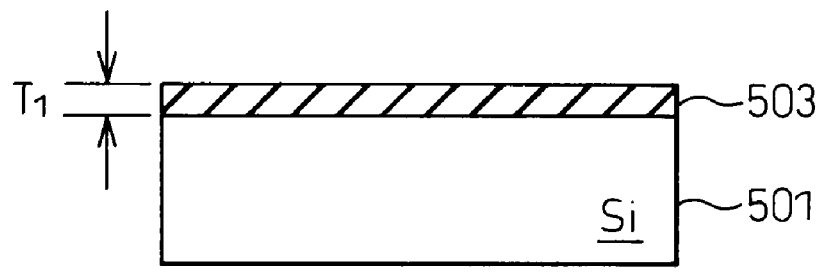

Next, at step S2, as shown in FIG. 7A, the surface of the silicon layer 501 of the wafer W is treated by plasma oxidation. Due to this, as shown in FIG. 7B, a silicon oxide film 503 is formed on the silicon layer 501. The procedure and conditions of the plasma oxidation treatment are as explained below.

[Procedure of Plasma Oxidation Treatment]

First, the inside of the treatment vessel 1 of the plasma treatment apparatus 100 is evacuated and Ar gas, $O_2$ gas, and, if necessary, $H_2$ gas are introduced from the inert gas feed source 19a, oxygen-containing gas feed source 19b, and if necessary hydrogen gas feed source 19c of the gas feed device 18 by predetermined flow rates through the gas introduction part 15 to the inside of the treatment vessel 1. In this way, the inside of the treatment vessel 1 is adjusted to a predetermined pressure. By including hydrogen in the treatment gas, it is possible to raise the oxidation rate, so this is advantageous.

Next, microwaves of a predetermined frequency, for example, 2.45 GHz, generated by the microwave generating device 39 are introduced through the matching circuit 38 to the waveguide 37. The microwaves introduced to the waveguide 37 successively pass through the rectangular waveguide 37b and coaxial waveguide 37a and are supplied through the internal conductor 41 to the planar antenna 31. That is, the microwaves are propagated inside the rectangular waveguide 37b by the TE mode, then the TE mode microwaves are converted by the mode converter 40 to the TEM mode and propagated through the coaxial waveguide 37a inside a flat waveguide comprised of the cover member 34 and planar antenna 31. Further, the microwaves are radiated from the slot shaped microwave radiation holes 32 formed passing through the planar antenna 31 through the transmission plate 28 to the space above the wafer W in the treatment vessel 1. The microwave output at this time, for example, when treating a wafer W of a 200 mm diameter or more, can be selected from 1000 W to 4000 W in range in accordance with the objective.

Due to the microwaves radiated from the planar antenna 31 through the transmission plate 28 to the treatment vessel 1, an electromagnetic field is formed in the treatment vessel 1 whereby the Ar gas and $O_2$ gas (and further if necessary $H_2$ gas) are converted to plasma. This excited plasma has an about $1\times10^{10}$ to $5\times10^{12}/cm^3$ high density and, near the wafer W, an about 1.2 eV or less low electron temperature due to microwaves being radiated from the large number of microwave radiation holes 32 of the planar antenna 31. The plasma formed in this way does not damage the base film by ions etc. Further, due to the actions of the active species $O_2^+$ ions or $O(^1D_2)$ radicals in the plasma, the wafer W is treated by plasma oxidation. That is, the silicon of the wafer W surface is oxidized, whereby Si—O bonds are formed and a silicon oxide film is formed.

Plasma Oxidation Treatment Conditions

As the treatment gas of the plasma oxidation treatment, a gas containing a rare gas and an oxygen-containing gas is preferably used. As the rare gas, Ar gas is preferably used, while as the oxygen-containing gas, $O_2$ gas is preferably used. At this time, the volume flow rate ratio of the $O_2$ gas to the total treatment gas (percentage of $O_2$ gas flow rate/total treatment gas flow rate), from the viewpoint of making $O_2^+$ ions or $O(^1O_2)$ radicals dominant in the active species in the plasma, is preferably made 0.2% to 10% in range, more preferably 0.5% to 3% in range. Further, the volume flow rate ratio of the $H_2$ gas to the total treatment gas (percentage of $H_2$ gas flow rate/total treatment gas flow rate), from the viewpoint of raising the rate of plasma oxidation treatment, is preferably made 0.2% to 10% in range, more preferably 0.2% to 2% in range.

In the plasma oxidation treatment, for example, the flow rate of Ar gas is 500 ml/min (sccm) to 5000 ml/min (sccm) in range, the flow rate of $O_2$ gas is 0.5 ml/min (sccm) to 1000 ml/min (sccm) in range, and the flow rate of $H_2$ gas is 0.5 ml/min (sccm) to 100 ml/min (sccm) in range, so it is preferable to set the above flow rate ratios.

Further, the treatment pressure, from the viewpoint of making $O_2^+$ ions or $O(^1D_2)$ radicals dominant in the active species in the plasma, is preferably 6.7 Pa to 267 Pa in range, more preferably 6.7 Pa to 133 Pa in range. If the treatment pressure in the plasma oxidation treatment exceeds 267 Pa, the radicals become dominant as active species of oxidation in the plasma, so the oxidation falls and flattening of the Si/$SiO_2$ interface becomes difficult.

Further, the power density of the microwaves, from the viewpoint of efficient generation of the $O_2^+$ ions or $O(^1D_2)$ radicals of the active species in the plasma, is preferably 0.51 W/cm$^2$ to 2.56 W/cm$^2$ in range. Note that, the power density of the microwaves means the microwave power fed per 1 cm$^2$ area of the transmission plate 28 (same below). For example, when treating a 200 mm diameter or larger wafer W, the microwave power is preferably made 1000 W to 5000 W in range.

Further, the heating temperature of the wafer W is preferably made, as the temperature of the carrying table 2, for example, 200° C. to 600° C. in range, more preferably 400° C. to 600° C. in range.

The above conditions are stored in the storage unit 53 of the control unit 50 as recipes. Further, the process controller 51 reads out the recipes and sends control signals to the components of the plasma treatment apparatus 100 such as the gas feed device 18, vacuum pump 24, microwave generating device 39, heater power source 5a, etc. so as to treat the wafer under the desired conditions by plasma oxidation.

The silicon oxide film 503 formed on the silicon layer 501 of the wafer W by the above plasma oxidation treatment step preferably has a film thickness T1 of the final target film thickness minus the increase in the subsequently performed thermal oxidation treatment step. That is, the film thickness T1 is preferably made 70% to 98% of the target film thickness in range, more preferably 80% to 95% in range. If the silicon oxide film 503 has a film thickness T1 of less than 70% of the target film thickness, the effect of flattening the interface by the plasma oxidation may not be sufficiently obtained, while if it has a film thickness T1 of over 98% of the target film thickness, the effect of improvement of the film quality by the thermal oxidation treatment is not sufficiently obtained.

Figure 7C:
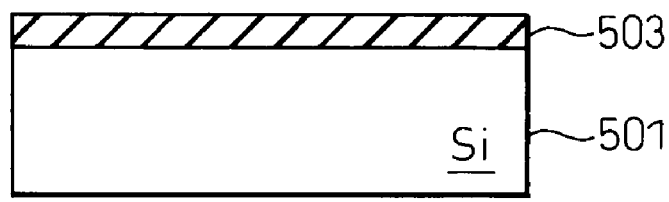

Next, at step S3, the wafer W on which the silicon oxide film 503 is formed is transported to the thermal oxidation treatment apparatus 101 (process module 101a or 101b). This is performed by the transfer apparatus 109 in the vacuum side transfer chamber 103 in the vacuum state as is. Next, at step S4, as shown in FIG. 7C, the silicon oxide film 503 is treated by thermal oxidation. The procedure and conditions of the thermal oxidation treatment performed using the thermal oxidation treatment apparatus 101 are as follows:

Procedure of Thermal Oxidation Treatment

First, in the thermal oxidation treatment apparatus 101, a wafer W is set at the wafer support part 77 in the treatment vessel 71, then an air-tight space is formed. Next, if, under the control of the process controller 51, predetermined power is fed from a not shown power source to the heating elements (not shown) of the tungsten lamps 76 of the bottom heat emitting unit 72 and top heat emitting unit 74 to turn the on, the heating elements emit heat. The generated heat rays pass through the quartz member 79 and quartz member 80a to reach the wafer W whereupon the wafer W is rapidly heated from above and below under conditions based on the recipe (temperature elevation rate, heating temperature, gas flow rate, etc.) While heating the wafer W, the gas feed device 83 introduces $O_2$ gas and other oxygen-containing gases by predetermined flow rates and operates a not shown exhaust apparatus to evacuate the exhaust pipe 84, whereby the inside of the treatment vessel 71 is made a reduced pressure state oxidizing atmosphere.

During the thermal oxidation treatment, a not shown rotation mechanism is used to make the support part 77 rotate as a whole about the vertical axis, that is, in the horizontal direction at for example ad 80 rpm rotational speed and thereby make the wafer W rotate. As a result, uniformity of the amount of heat supplied to the wafer W is secured. Further, during the heat treatment, the temperature of the hot liner 78 is measured by the pyrometer 81 and thereby the temperature of the W can be indirectly measured. The data of the temperatures measured by the pyrometer 81 is fed back to the process controller 51. When there is a difference from the temperature setting in the recipe, the feed of power to the tungsten lamps 76 is adjusted.

After the heat treatment is finished, the tungsten lamps 76 of the bottom heat emitting unit 72 and top heat emitting unit 74 are turned off and the inside of the treatment vessel 71 is flushed from a not shown purge port with nitrogen or another purge gas and the exhaust pipe 84 is evacuated to cool the wafer W which is then unloaded.

Conditions of Thermal Oxidation Treatment

The oxygen-containing gas of the thermal oxidation treatment is not particularly limited so long as a gas able to form an oxidizing atmosphere in the treatment vessel 71. For example, $O_2$ gas, NO gas, $N_2O$ gas, $H_2O$ (water vapor)$_m$ etc. is preferable. Into these, an inert gas such as Ar or another rare gas or $N_2$, $H_2$, etc. may be mixed in. In the method of the present invention, in particular wet thermal oxidation treatment using $H_2O$ is preferable due to the large effect of improvement of the TDDB characteristics (Rd and Qbd). At this time, the flow rate of the oxygen-containing gas may be set to 0.5 ml/min (sccm) to 1000 ml/min (sccm) in range.

Further, the treatment pressure is preferably 10 Pa to 20,000 Pa in range, more preferably 12 Pa to 18,000 Pa in range.

Further, the heating temperature of the wafer W is preferably made, as the measurement temperature of the pyrometer 81, for example 800° C. to 1100° C. in range, more preferably 900° C. to 1100° C. in range.

The above conditions are stored in the storage unit 53 of the control unit 50 as recipes. Further, the process controller 51 reads out the recipes and sends control signals to the components of the thermal oxidation treatment apparatus 101 such as the gas feed device 83, vacuum pump 24, bottom heat emitting unit 72, top heat emitting unit 74 (tungsten lamps 76), etc. so as to treat the wafer under the desired conditions by thermal oxidation.

Figure 7D:
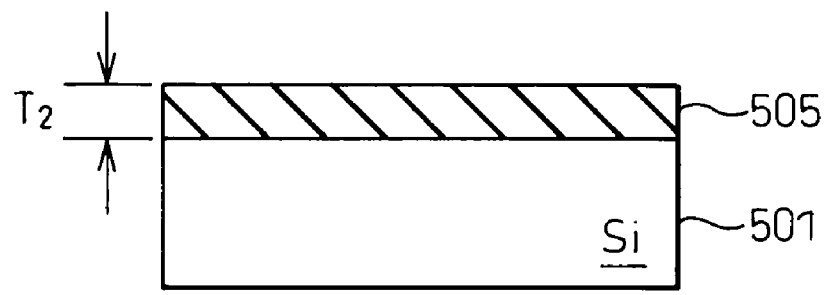

Due to the thermal oxidation treatment of step S4, as shown in FIG. 7D, a silicon oxide film 505 is formed by a film thickness T2. This film thickness T2 is the target film thickness. T2>T1. The film thickness T2, in the case of application as a tunnel oxide film of a flash memory device, is preferably 4 nm to 10 nm, more preferably 4 nm to 8 nm.

After forming the silicon oxide film 505 in the above way, at step S5, the transfer apparatus 109 in the vacuum transfer chamber 103 is used to unload the treated wafer W from the thermal oxidation treatment apparatus 101 (process module 101a or 101b) and the above procedure is used to store it in the wafer cassette CR of the load port LP.

Next, the experimental data on which the present invention is based will be explained.

Test Example 1

MOS capacitors [active size (gate area) 2×2 μm] using the silicon oxide film formed by the film-forming methods described below as the gate insulating film and forming polycrystalline silicon electrodes on the (100) face of 19p type silicon were produced, were tested by a time dependent dielectric breakdown (TDDB) test at a constant current stress of 0.1 A/cm$^2$ at 56 measurement points, and were measured for Rd characteristic and Qbd characteristic. Further, the formed silicon oxide films were investigated for physical properties.

Method P: A silicon substrate was treated by plasma oxidation to form a silicon oxide film (P-Ox film).
Treatment time 100 seconds: film thickness 8.5 nm
Method Th: A silicon substrate was treated by thermal oxidation to form a silicon oxide film (Th-Ox film).
Treatment time 420 seconds: film thickness 8.5 nm
Method TP: A silicon substrate was treated by thermal oxidation, then the silicon oxide film was treated by plasma oxidation to form a silicon oxide film (TP-Ox film).
Thermal oxidation 420 seconds (film thickness 8.5 nm)
Plasma oxidation 100 seconds (film thickness 0.5 nm)
Method PT: A silicon substrate was treated by plasma oxidation to form a silicon oxide film which was then treated by thermal oxidation to form a silicon oxide film (PT-Ox film).
Plasma oxidation 100 seconds (film thickness 8.5 nm)
Thermal oxidation 30 seconds (film thickness 0.5 nm)

Plasma Oxidation Conditions

A plasma treatment apparatus of a similar configuration to that of FIG. 2 was used.
Ar gas flow rate: 500 ml/min (sccm)
$O_2$ gas flow rate: 5 ml/min (sccm)
$H_2$ gas flow rate: 5 ml/min (sccm)
Flow rate percentage ($O_2$/Ar+$O_2$+$H_2$): about 1%
Treatment pressure: 133 Pa
Temperature of carrying table 2: 400° C.
Microwave power: 2750 W
Microwave power density: 1.4 W/cm$^2$ (per area 1 cm$^2$ of transmission plate)

Thermal oxidation conditions

A furnace with a water vapor generator (WVG) was used.
$O_2$ gas flow rate: 900 ml/min (sccm)
$H_2$ gas flow rate: 450 ml/min (sccm)
Treatment pressure: 15000 Pa
Treatment temperature: 950° C.

Figure 8:
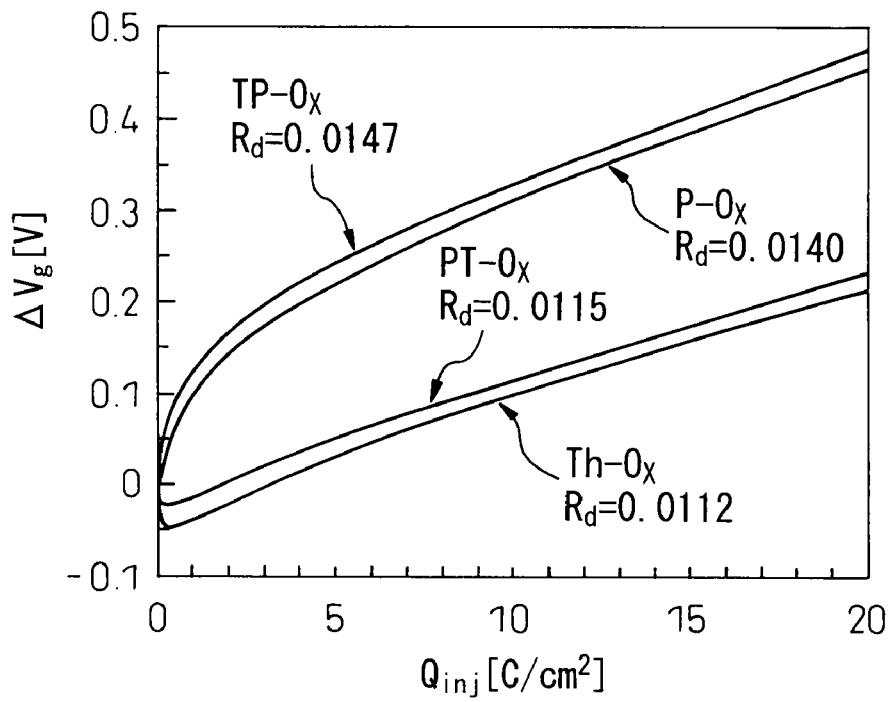
FIG. 8 is a graph showing a V-t curve in a TDDB test of Test Example 1.

FIG. 8 shows the result of ΔVg charge stress dependency (V-t measurement) when applying a constant current stress at 0.1 A/cm$^2$. The abscissa shows the injected charge (Qinj) due to the voltage stress. Further, the Rd characteristic was described in the drawing. A PT-Ox film, like a Th-Ox film, exhibits a low superior Rd characteristic, while a P-Ox film and TP-Ox film were higher in Rd compared to the PT-Ox film or Th-Ox film.

Figure 9:
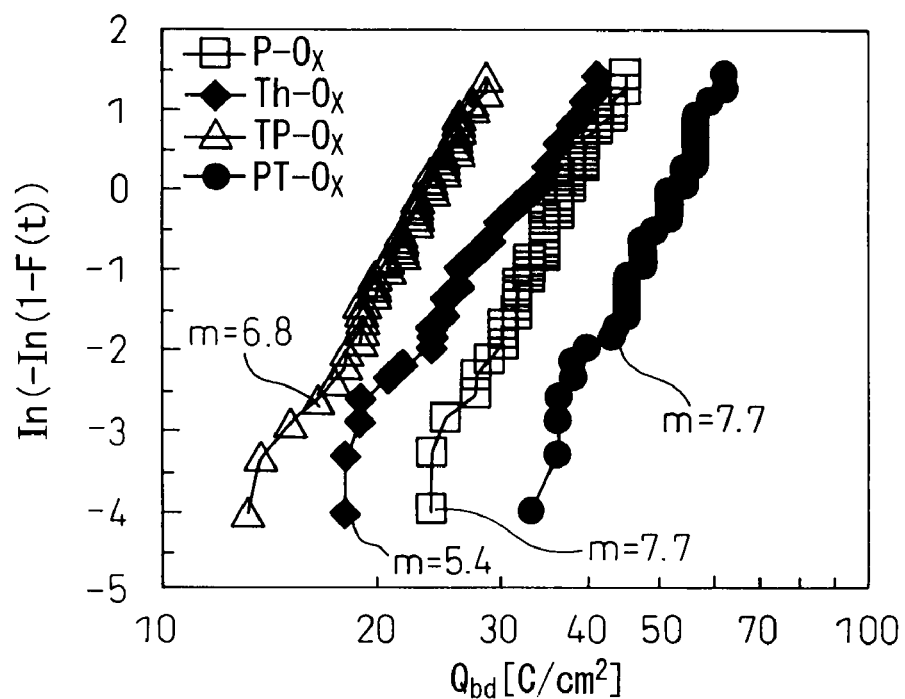
FIG. 9 is a graph showing the results of Qbd measurement in a TDDB test of Test Example 1.

FIG. 9 shows the result of Qbd measurement. The ordinate is a Weibull plot, while the abscissa shows the Qbd value. Further, the value of m in the figure shows the slant of the plot. From FIG. 9, the Qbd characteristic is superior in the order of the PTOx film, P-Ox film, Th-Ox film, and TP-Ox film. In particular, the PT-Ox film exhibited a more superior Qbd characteristic than the Th-Ox film or P-Ox film. On the other hand, the TP-Ox film was worse in Qbd characteristic than the Th-Ox film or the P-Ox film.

In this way, even if combining plasma oxidation and thermal oxidation, a large difference arises in the electrical characteristics due to the order of treatment. When treating a silicon oxide film formed by plasma oxidation by thermal oxidation, an effect of improvement of the Rd characteristic or Qbd characteristic was obtained.

Further, the slant m of the Weibull plot is 7.7 for both the PT-Ox film and P-Ox film or a sharp, good slant. It was confirmed that the silicon oxide film had little fluctuation in the Qbd.

Figure 10:
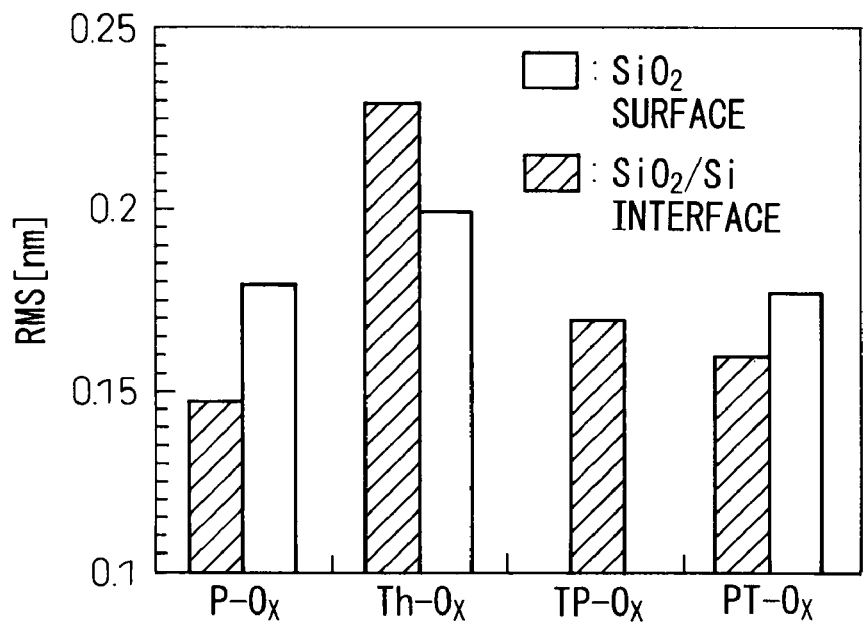
FIG. 10 is a graph showing a mean roughness (RMS) of an $SiO_2$ surface and $SiO_2/Si$ interface.

Further, FIG. 10 shows the mean roughness (RMS) by an atomic force microscope (AFM) of a surface of a silicon oxide film ($SiO_2$) formed by the above method and an interface between the silicon oxide film ($SiO_2$) and Si. From this FIG. 10, it was confirmed that the $SiO_2$ surface and $SiO_2$/Si interface of a PT-Ox film are much flatter than the $SiO_2$ surface and $SiO_2$/Si interface of a Th-Ox film and that an interface flatness equal to that of a P-Ox film was exhibited. This result dovetails with the results of the distribution of the Weibull plot of FIG. 9 (slant m).

Figure 11:
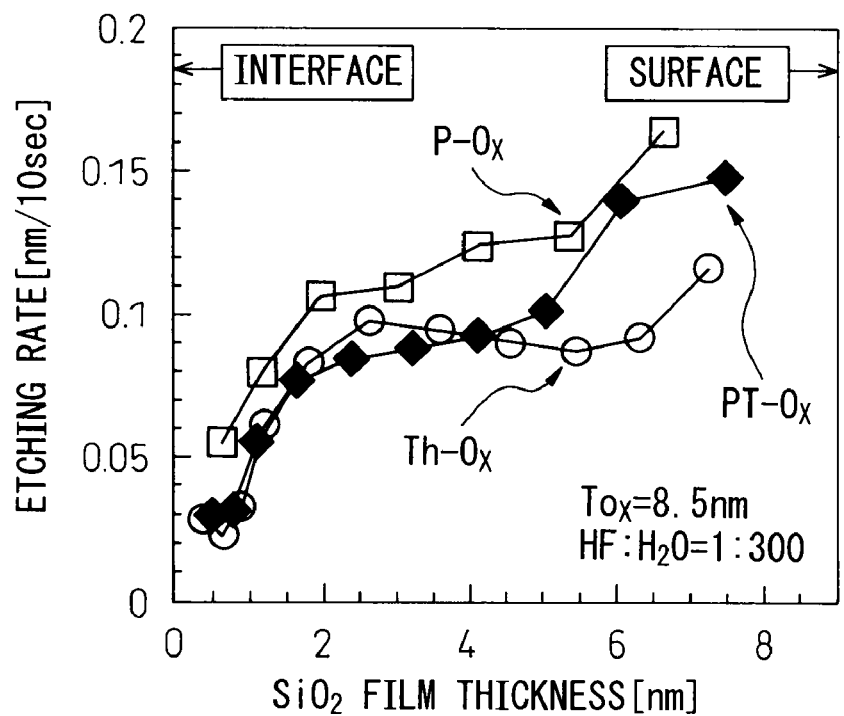
FIG. 11 is a graph showing the relationship of the film thickness of the silicon oxide film and the wet etching rate.

FIG. 11 shows the results when wet etching a silicon oxide film formed by the above method using dilute hydrofluoric acid (DHF: HF:$H_2O$=1:300). A P-Ox film was faster in etching rate than a Th-Ox film. On the other hand, a PT-Ox film was close to the Th-Ox film. In particular, in a region within 4 nm from the interface, the etching rates of the two films were substantially equal. This result suggests the possibility of the plasma oxide film being improved in density by the heat treatment.

Figure 12:
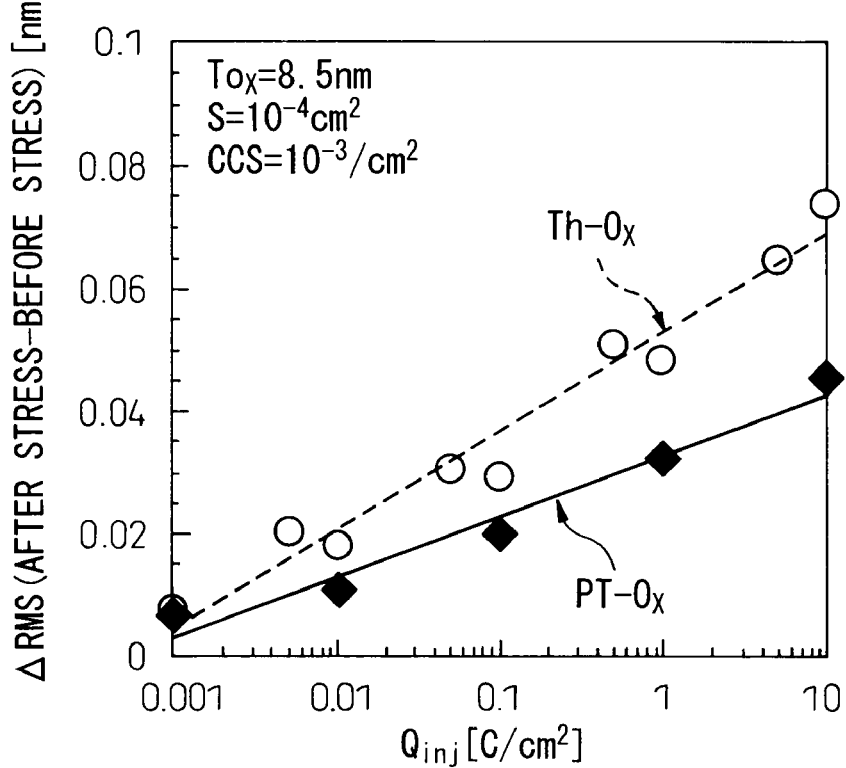
FIG. 12 is a graph showing an injected charge (Qinj) dependency of an amount of change of RMS ($\Delta$RMS) in the SISuR method.
Figure 13:
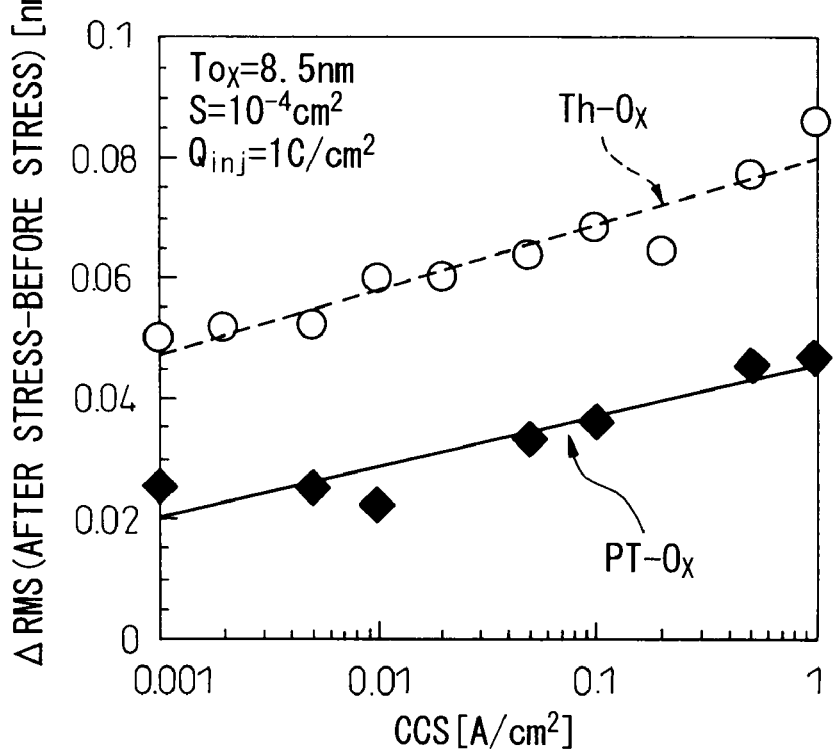
FIG. 13 is a graph showing a constant current stress (CCS) dependency of an amount of change of RMS ($\Delta$RMS) in the SISuR method.

FIG. 12 and FIG. 13 show the changes in mean roughness (RMS) before and after stress at the exposed surface obtained by etching the silicon oxide film down to half in accordance with the SISuR method [see stress induced etched oxide surface roughness method: K. Yamabe et al., Jpn. J. Appl. Phys., 38, L1453 (1999)] (RMS after stress—RMS before stress). FIG. 12 shows the injected charge (Qinj) dependency of the change of RMS in 10$^{-3}$ A/cm$^2$ constant current stress, while FIG. 13 shows the constant current stress (CCS) dependency of the change of RMS when the injected charge (Qinj) is 1 C/cm$^2$. From FIG. 12 and FIG. 13, it is learned that the roughness of a surface exposed by etching increases after stress, so trap sites are formed by the stress. However, it was learned that the change of RMS of a PT-Ox film is clearly smaller than that of a Th-Ox film and effects of stress are not easily felt. Further, the results of the $SiO_2$ surface and $SiO_2$/Si interface shown in FIG. 10 and the results of the SISuR method of FIG. 12 and FIG. 13 are similar in trend, so it was learned that the flatness of the $SiO_2$ surface or $SiO_2$ interface is an important element in control of damage to a silicon oxide film.

In the dielectric breakdown of a silicon oxide film, it is believed that two components are at play. One is the "average component" where the insulating film as a whole deteriorates in an average manner, while the other is the "fluctuating component" where the insulating film locally deteriorates. For evaluation of the average component, judgment is possible by the magnitude of the slant of the linear region (Rd) appearing in V-t measurement (see FIG. 8). The smaller the value of Rd, the slower the progress of deterioration and the better the film in durability. On the other hand, the fluctuating component is believed to be dependent on the roughness of the $SiO_2$ surface or $SiO_2/Si$ interface. The flatter, the smaller the fluctuating component and the better the film in durability. Therefore, if it were possible to prepare a silicon oxide film with a small value of Rd and a flat $SiO_2$ surface or $SiO_2/Si$ interface, a superior insulation characteristic should be held. In the method of the present invention, by treating the silicon oxide film formed by plasma oxidation treatment by thermal oxidation, it was possible to achieve both improvement of the overall film quality of the silicon oxide film by the thermal oxidation treatment and improvement of the flatness of the $SiO_2$ surface and $Si/SiO_2$ interface by the plasma oxidation treatment. That is, due to the method of the present invention, it was possible to form a silicon oxide film provided with both superiority in improvement of the average component by thermal oxidation treatment and superiority in improvement of the fluctuating component due to plasma oxidation treatment.

In the results shown above, at the PT-Ox film, a flat $SiO_2$ surface and $SiO_2/Si$ interface similar to that of ordinary plasma treatment (method P) were maintained while the formation of trap sites at the film was suppressed more than at the Th-Ox film. Therefore, it was confirmed that by treating a silicon oxide film formed by plasma oxidation by thermal oxidation, it is possible to form a dense, superior durability, high reliability silicon oxide film.

Test Example 2

Except for making the silicon oxide film a film thickness of 5.5 nm in Test Example 1, the same procedure was followed as in Test Example 1 to form a P-Ox film, Th-Ox film, and TP-Ox film. Note that, the PT-Ox film was made a silicon oxide film of a film thickness of 4.5 nm formed by plasma oxidation treatment and a film thickness of 1.0 nm formed by thermal oxidation treatment. Further, a MOS capacitor [active size (gate area) 2×2 μm] was produced and subjected to a time dependent dielectric breakdown (TDDB) test at a constant current stress 0.5 A/cm$^2$ at 56 measurement points and measured for the Qbd characteristic in the same way as Test Example 1.

Figure 14:
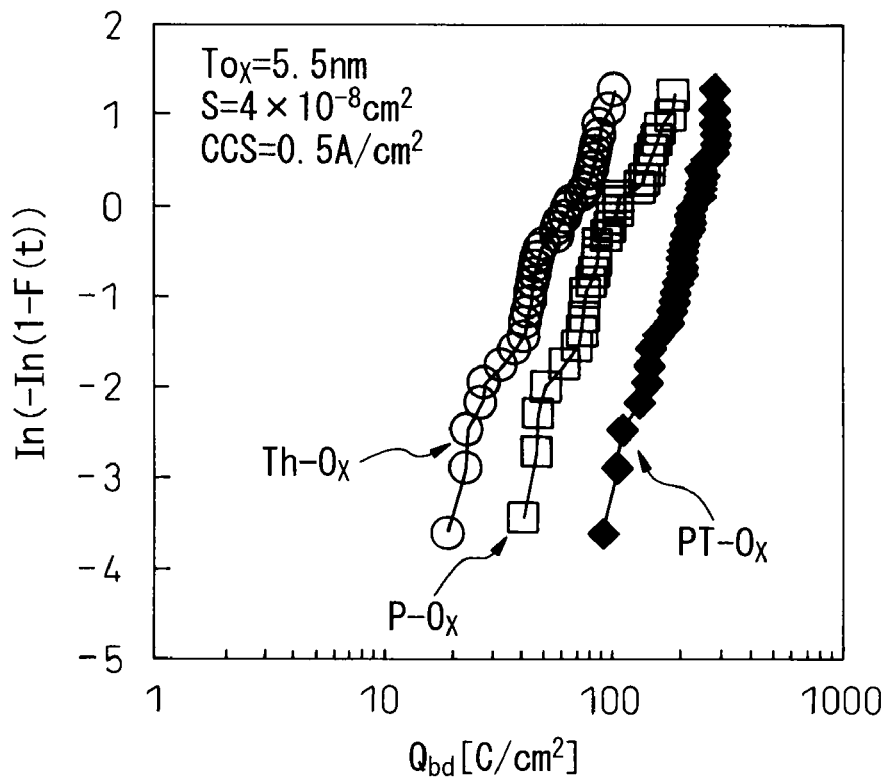
FIG. 14 is a graph showing the results of Qbd measurement in Test Example 2.

As shown in FIG. 14, even when the film thickness is a thin 5.5 nm, the Qbd characteristic tended to be similar to that of Test Example 1 (here, only the results illustrated).

Figure 15:
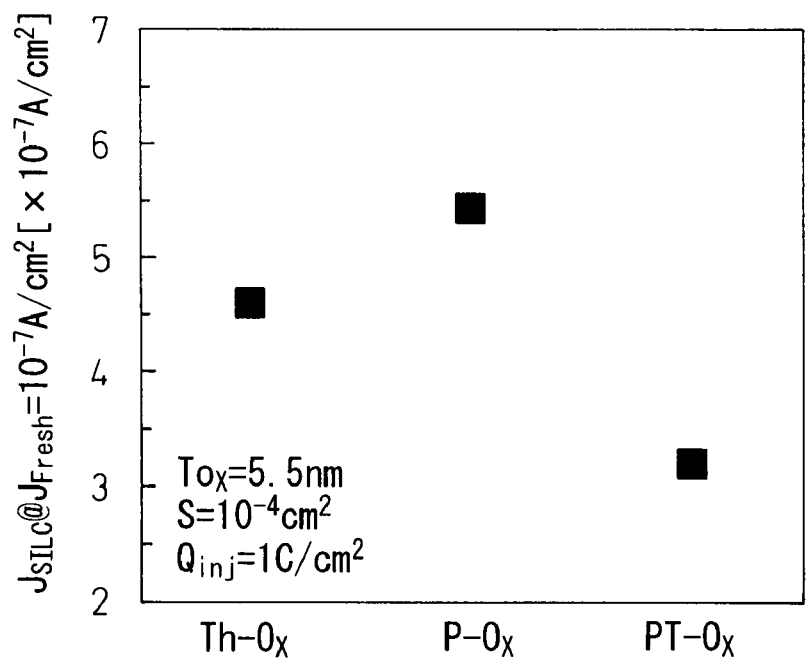
FIG. 15 is a graph showing the results of SILC measurement in Test Example 2.

Further, the P-Ox film, Th-Ox film, and TP-Ox film were given constant current stress (CCS) (injected charge made 1 C/cm$^2$) and measured for the SILC (Stress Induced Leakage Current: JSILC) at the voltage where the initial leakage current ($J_{Fresh}$) reached $10^{-7}$ A/cm$^2$. As shown in FIG. 15, the SILC was the lowest with the PT-Ox film and became successively higher with the Th-Ox film and the P-Ox film in that order. The PT-Ox film exhibited a value as much as 30% lower than the Th-Ox film. From the above results, it was confirmed that a silicon oxide film formed by treated a silicon oxide film formed by plasma oxidation by further thermal oxidation has a superior Qbd characteristic and SILC characteristic compared with a silicon oxide film formed by thermal oxidation.

Test Example 3

MOS capacitors were prepared in the same way as Test Example 1 by treating silicon oxide films formed by plasma oxidation treatment by combinations of heat treatment under different conditions (including thermal oxidation treatment) and were evaluated for electrical characteristics. The target film thickness was in each case made 8 nm. The raising and lowering the temperature in the heat treatment were timed to when the conditions were right.

Film-forming method P: A silicon substrate was treated for 103 seconds by plasma oxidation to form a silicon oxide film (P-Ox film).

Film-forming method PN: A silicon substrate was treated for 103 seconds by plasma oxidation, then treated for 30 seconds by $N_2$ annealing to form a silicon oxide film (PN-Ox film).

Film-forming method PD: A silicon substrate was treated for 93 seconds by plasma oxidation, then treated for 30 seconds by dry oxidation to form a silicon oxide film (PD-Ox film).

Film-forming method PW: A silicon substrate was treated for 83 seconds by plasma oxidation, then treated for 30 seconds by wet oxidation to form a silicon oxide film (PW-Ox film).

Plasma Oxidation Conditions

Made conditions similar to Test Example 1.

$N_2$ Annealing Conditions

Reduced pressure annealing apparatus used.
$N_2$ gas flow rate: 1350 ml/min (sccm)
Treatment pressure: 15000 Pa
Treatment temperature: 950° C.

Dry Oxidation Conditions $O_2$ gas flow rate: 1350 ml/min (sccm)
Treatment pressure: 15000 Pa
Treatment temperature: 950° C.

Wet Oxidation Conditions

Furnace with water vapor generator used.
$O_2$ gas flow rate: 900 ml/min (sccm)
$H_2$ gas flow rate: 450 ml/min (sccm)
Treatment pressure: 15000 Pa
Treatment temperature: 950° C.

Figure 16:
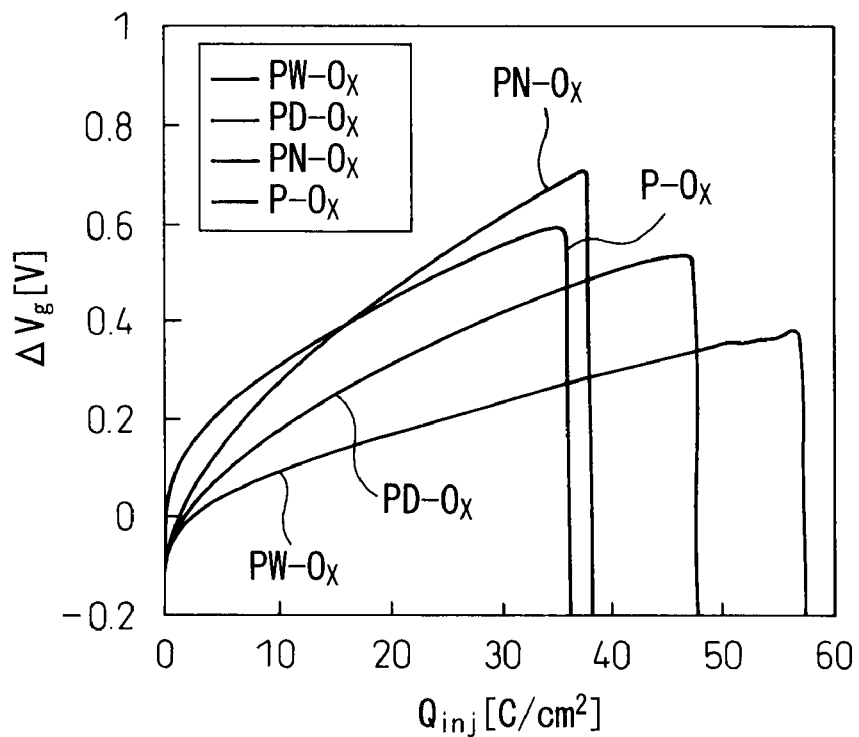
FIG. 16 is a graph showing a V-t curve in Test Example 3.

FIG. 16 shows the charge stress dependency of ΔVg. The abscissa shows the injected charge due to voltage stress (V-t measurement). A PW-Ox film exhibited the most superior Rd characteristic (Rd=0.0060 V·cm$^2$/C), next a PD-Ox film (Rd=0.0091V·cm$^2$/C) and further a P-Ox film (Rd=0.0116V·cm$^2$/C) and PN-Ox film (Rd=0.0156V·cm$^2$/C) in that order.

Figure 17:
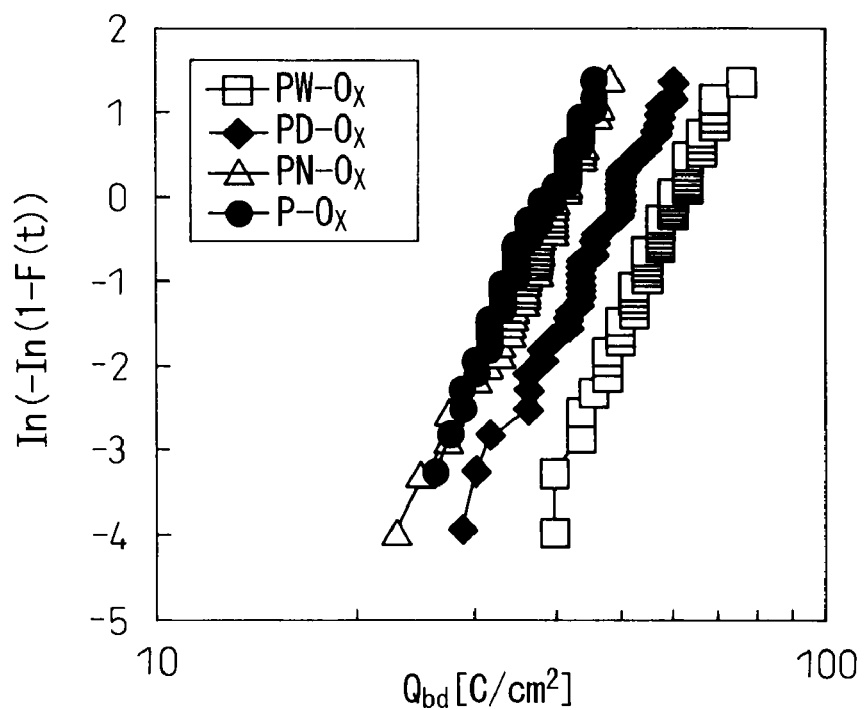
FIG. 17 is a graph showing the results of a Qbd test in Test Example 3.

FIG. 17 shows the results of the Qbd characteristic. The ordinate shows the Weibull plot, while the abscissa shows the Qbd value. From FIG. 17, the Qbd characteristic is superior in the order of the PW-Ox film, PD-Ox film, and P-Ox film/PN-Ox film (substantially the same).

From the above results, it was learned that by performing wet oxidation treatment or dry oxidation treatment after plasma oxidation treatment, the silicon oxide film was raised in durability and the film could be made longer in life, but there was no effect with $N_2$ annealing. This is believed to be because compared even with $N_2$ annealing, thermal oxidation has a larger effect of improvement of the plasma oxide film and with $N_2$ annealing, H atoms disassociate from Si—OH bonds, Si—H bonds, and other weak bonds, bond loss sites increase, and trap sites increase. Further, in thermal oxidation as well, it was learned that wet oxidation is particularly preferable. This is believed to be because —OH bonds with the trap sites in the film to reduce bond loss. Note that, the effect of improvement of the durability of the silicon oxide film is similarly obtained even with thermal radical oxidation using ISSG—one type of wet oxidation.

In the above way, it was confirmed that by treating a surface by plasma oxidation, then thermal oxidation, both a good Qbd characteristic and Rd characteristic could be achieved and the life of the silicon oxide film could be prolonged. Therefore, the silicon oxide film formed by the method of the present invention has few impurities, dangling bonds, and other defects and can be preferably used for applications where electrical stress is repeatedly applied such as for tunnel oxide films in flash memories and other semiconductor memory devices, silicon oxide films for insulation use between floating gate electrodes and control gate electrodes, gate insulating films in power transistors, power MOSFETs, and other power devices (power use semiconductor devices), etc.

Figure 18:
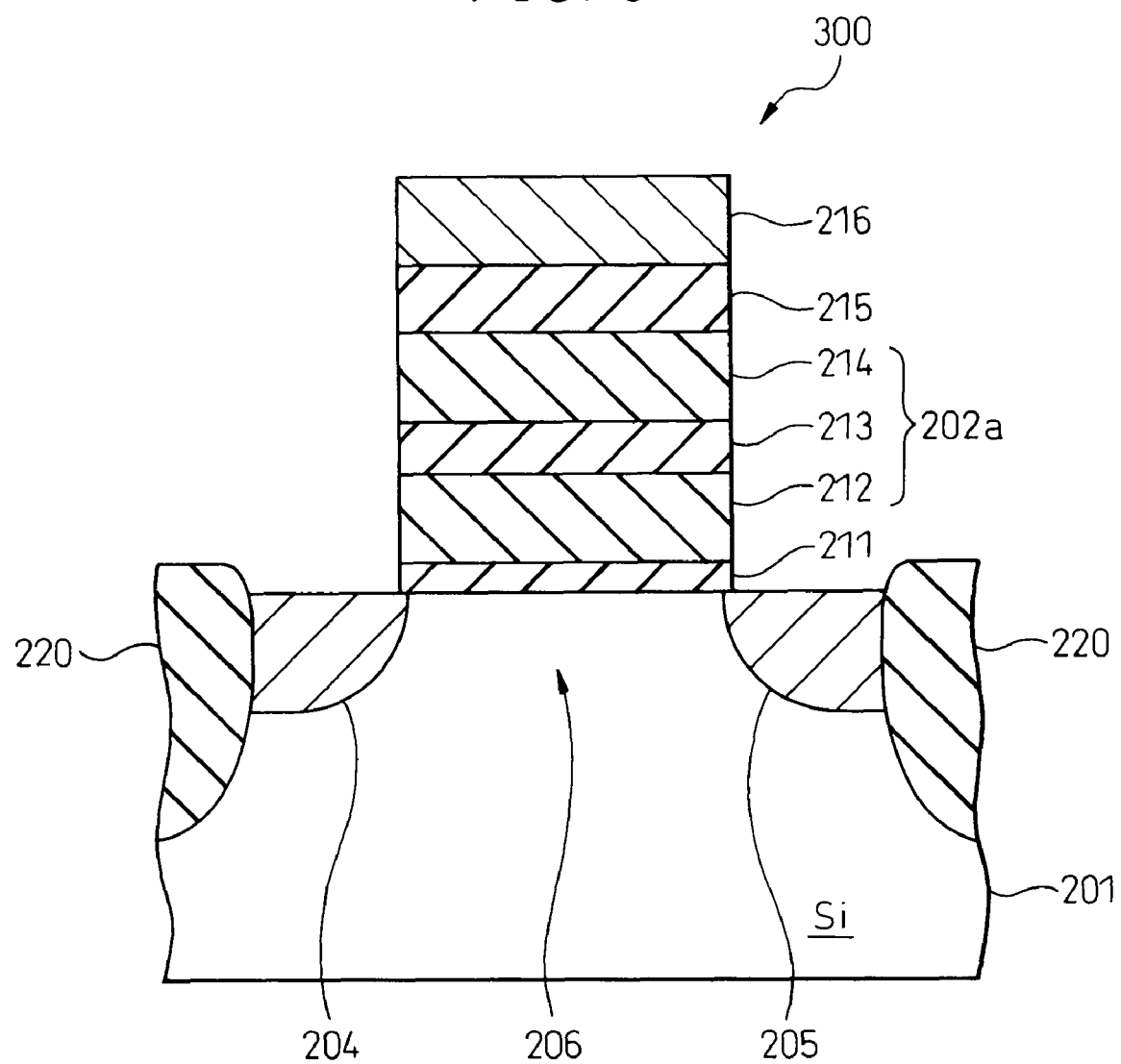
FIG. 18 is a schematic cross-sectional view showing an example of the configuration of a semiconductor memory device able to use the method of the present invention.

Further, the silicon oxide film formed by the method of the present invention can be utilized as a tunnel oxide film of a flash memory device. For example, it can be suitably utilized as a tunnel oxide film of a semiconductor memory device 300 of the SONGS structure shown in FIG. 18. This semiconductor memory device 300 is provided with a semiconductor layer consisting of a p-type silicon substrate 201, a tunnel oxide film 211 formed stacked over this p-type silicon substrate 201, a first silicon nitride film 212, a second silicon nitride film 213, a third silicon nitride film 214, and a block silicon oxide film 215 and further over the same a control gate electrode 216. Among these, the first silicon nitride film 212, second silicon nitride film 213, and third silicon nitride film 214 for a silicon nitride film stack 202a serving as a region for storing a charge. Further, the silicon substrate 201 is formed with a first source-drain 204 and second source-drain 205 as n-type diffusion layers at a predetermined depth from the surface so as to be positioned at the two sides of the gate electrode 216. The space between the two forms the channel formation region 206. Note that, reference numeral 220 in FIG. 18 shows a device isolation film made of silicon dioxide ($SiO_2$) defining a device region of the semiconductor memory device 300. Further, by applying the method of the present invention, for example, the method explained with reference to FIGS. 7A to 7D, for forming the tunnel oxide film 211, a tunnel oxide film 211 superior in durability even when repeatedly applying electrical stress is obtained, so the semiconductor memory device 300 can be given a high reliability.

Figure 19:
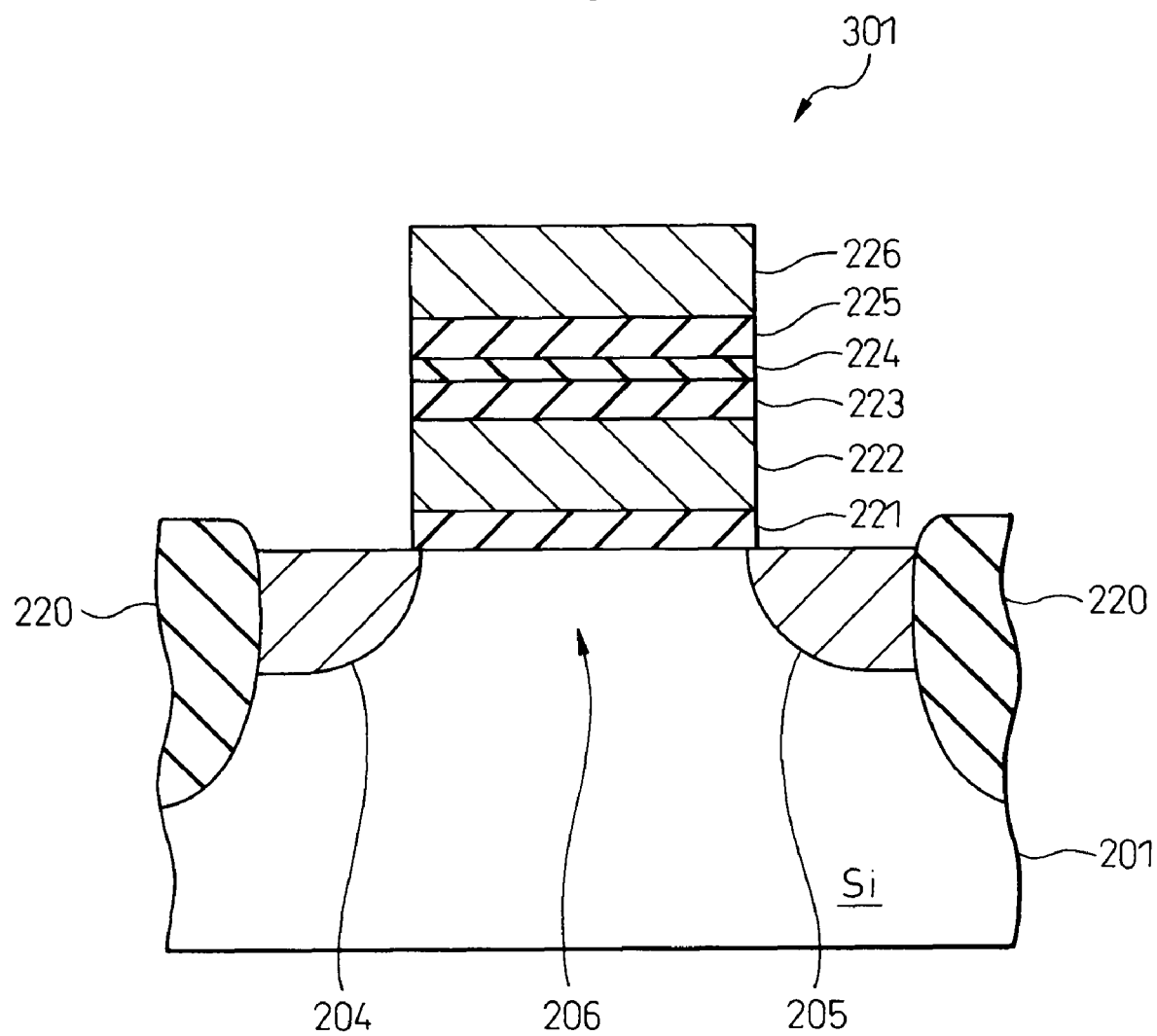
FIG. 19 is a schematic cross-sectional view showing an example of the configuration of another semiconductor memory device able to use the method of the present invention.

Further, the silicon oxide film formed by the method of the present invention may for example be suitably utilized as the tunnel oxide film of a floating gate structure semiconductor memory device 301 such as shown in FIG. 19. This semiconductor memory device 301 is provided with a p-type silicon substrate 201 as a semiconductor layer and, formed stacked over this p-type silicon substrate 201, a tunnel oxide film 221, floating gate electrode 222, an ONO structure forming silicon oxide film 223, silicon nitride film 224, and silicon oxide film 225, and further a control gate electrode 226 stacked over them. Further, the silicon substrate 201 is formed at predetermined depths from its surface with n-type diffusion layers forming a first source-drain 204 and second source-drain 205 and with a channel formation region 206 between them. Reference numeral 220 in FIG. 19 indicates a device isolation film made of silicon dioxide ($SiO_2$) defining a device region of the semiconductor memory device 301. Further, by applying the method of the present invention, for example, the method explained with reference to FIGS. 7A to 7D, to form the tunnel oxide film 221, a tunnel oxide film 221 superior in durability even with repeated application of electrical stress is obtained, so the semiconductor memory device 301 can be given a high reliability.

Here, giving an example of a typical procedure, an example of application of the method of the present invention to production of a semiconductor memory device 300 will be explained. First, a silicon substrate 201 formed with a device isolation film 220 by the LOCOS (Local Oxidation of Silicon) method, STI (Shallow Trench Isolation) method, or other method is prepared. On its surface, for example, the method of the present invention explained with reference to FIGS. 7A to 7D is used to form a tunnel oxide film 211.

Next, on the tunnel oxide film 211, the plasma CVD method is used to successively form a first silicon nitride film 212, second silicon nitride film 213, and third silicon nitride film 214.

Next, on the third silicon nitride film 214, a block silicon oxide film 215 is formed. This block silicon oxide film 215, for example, can be formed by the CVD method. Further, on the block silicon oxide film 215, for example, the CVD method is used to form a polycrystalline silicon layer or metal layer or a metal silicide layer etc. and thereby form an electrode layer for forming a control gate electrode 216.

Next, photolithography is used and a patterned resist applied as a mask for etching the electrode layer and block silicon oxide film 215 to tunnel oxide film 211, whereby a gate multilayer structure having a patterned control gate electrode 216 and a plurality of insulating films is obtained. Next, n-type impurities are ion injected at a high concentration to the silicon surfaces adjoining the two sides of the gate multilayer structure to form a first source-drain 204 and second source-drain 205. In this way, a semiconductor memory device 300 of the structure shown in FIG. 18 can be produced.

Note that the semiconductor memory device for which the method of the present invention may be used is not limited to the configuration of FIG. 18 and FIG. 19.

Further, the method of the present invention has a large effect of flattening the $Si/SiO_2$ interface and can form a silicon oxide film superior in durability against electrical stress, so for example in a semiconductor memory device 301 configured as shown in FIG. 19, is preferably used for forming a silicon oxide film 223 forming part of an ONO structure insulating between a floating gate electrode 222 and control gate electrode 226 made of polycrystalline silicon etc.

Further, the method of the present invention is not limited to a semiconductor memory device and can also be applied to formation of the device isolation film in various types of semiconductor devices (for example, see the device isolation film 220 in FIG. 18 and FIG. 19). In that case as well, superior $Si/SiO_2$ interface controllability can be expected.

Further, the method of the present invention is not limited to the formation of a tunnel oxide film of a semiconductor memory device. For example, it may also be applied to the formation of a gate insulating film in a power transistor, power MOSFET, or other power device (power use semiconductor device).

Above, embodiments of the present invention were explained, but the present invention is not limited to the embodiments and can be modified in various ways. For example, in the embodiments, for the plasma oxidation treatment, an RLSA type microwave plasma treatment apparatus was used, but for example an ICP plasma type, ECR plasma type, surface reflection plasma type, magnetron plasma type, or other type of plasma treatment apparatus may be used. Further, the thermal oxidation treatment as well is not limited to a single-wafer type thermal oxidation treatment apparatus. Another type of thermal oxidation treatment apparatus, for example, a batch type thermal oxidation furnace, single-wafer or batch type thermal radical oxidation device etc. may be used.

What is claimed is:

1. A method of forming a silicon oxide film comprising:
   a first oxidation treatment step of treating silicon exposed at a surface of a treated object by plasma oxidation to form a silicon oxide film, said first oxidation treatment step is carried out by a plasma having a plasma density of $1\times10^{10}$ to $5\times10^{12}/cm^3$ and a 0.7 to 2 eV low electron temperature; and
   a second oxidation treatment step of further treating said silicon oxide film by thermal oxidation, the silicon oxide film formed has a target film thickness in a range of 4 nm to 10 nm and said first oxidation treatment step forms a silicon oxide film by a film thickness in a range of 70% to 98% of the target film thickness, and said second oxidation treatment step increases the film until reaching the target film thickness.

2. A method as set forth in claim 1, wherein said first oxidation treatment step has a treatment pressure of 6.7 Pa to 267 Pa in range.

3. A method as set forth in claim 1, wherein said first oxidation treatment step generates plasma by a treatment gas containing a rare gas, oxygen gas, and hydrogen gas and has a flow rate ratio of said oxygen gas to a total flow rate of said treatment gas of 0.2% to 10% in range.

4. A method as set forth in claim 1, wherein said first oxidation treatment step generates plasma by a treatment gas containing a rare gas, oxygen gas, and hydrogen gas and has a flow rate ratio of said oxygen gas to a total flow rate of said treatment gas of 0.5% to 3% in range.

5. A method as set forth in claim 1, wherein said first oxidation treatment step has a treatment temperature of 200° C. to 600° C. in range.

6. A method as set forth in claim 1, wherein said second oxidation treatment step is performed by heating in an oxidizing atmosphere to a temperature of 800° C. to 1100° C. in range.

7. A method as set forth in claim 1, wherein said second oxidation treatment step performs wet thermal oxidation treatment.

8. A method as set forth in claim 1, wherein said second oxidation treatment step treats said treated object by thermal oxidation while making it rotate in a horizontal direction.

9. A method as set forth in claim 2, wherein said first oxidation treatment step uses a treatment gas containing a rare gas, oxygen gas, and hydrogen gas to generate plasma and a flow rate ratio of said oxygen gas to a total flow rate of said treatment gas is 0.2% to 10% in range.

10. A method as set forth in claim 2, wherein said first oxidation treatment step uses a treatment gas containing a rare gas, oxygen gas, and hydrogen gas to generate plasma and a flow rate ratio of said oxygen gas to a total flow rate of said treatment gas is 0.5% to 3% in range.

11. A method as set forth in claim 1, wherein said silicon oxide film is a tunnel oxide film of a semiconductor memory device.

12. A method as set forth in claim 1, wherein said silicon oxide film is an insulating film for insulating between a floating gate electrode and control gate electrode in a semiconductor memory device.

13. A method as set forth in claim 1, wherein said silicon oxide film is a device isolation film defining a device region of a semiconductor device.

14. A method of production of a semiconductor memory device including of a silicon layer on which a charge storage layer and a gate electrode are formed via a tunnel oxide film, the method comprising:
    forming said tunnel oxide film by a first oxidation treatment step of treating silicon exposed at a surface of a treated object by plasma oxidation to form a silicon oxide film, said first oxidation treatment step is carried out by a plasma having a plasma density of $1\times10^{10}$ to $5\times10^{12}/cm^3$ and a 0.7 to 2 eV low electron temperature; and
    a second oxidation treatment step of further treating said silicon oxide film by thermal oxidation, the silicon oxide film formed has a target film thickness in a range of 4 nm to 10 nm and said first oxidation treatment step forms a silicon oxide film by a film thickness in a range of 70% to 98% of the target film thickness, and said second oxidation treatment step increases the film until reaching the target film thickness.

15. A method as set forth in claim 14, wherein said first oxidation treatment step has a treatment pressure of 6.7 Pa to 267 Pa in range.

16. A method as set forth in claim 14, wherein said first oxidation treatment step uses a treatment gas containing a rare gas, oxygen gas, and hydrogen gas to generate plasma and a flow rate ratio of said oxygen gas to a total flow rate of said treatment gas is 0.2% to 10% in range.

17. A method as set forth in claim 14, wherein said second oxidation treatment step is performed by heating in an oxidizing atmosphere to a temperature of 800° C. to 1100° C. in range.

18. A method as set forth in claim 14, wherein said second oxidation treatment step performs wet thermal oxidation treatment.

19. A non-transitory computer readable storage medium in which a control program operating on a computer is stored, said control program making the computer control a processing system so that, when run, the processing system having a plurality of treatment chambers for performing predetermined treatment on a treated object performs a method of forming a silicon oxide film, the method comprising:
    a first step of treating silicon exposed at a surface of the treated object by plasma oxidation to form a silicon oxide film, said first step is carried out by a plasma having a plasma density of $1\times10^{10}$ to $5\times10^{12}/cm^3$ and a 0.7 to 2 eV low electron temperature; and
    a second step of treating said silicon oxide film in an oxidizing atmosphere by thermal oxidation, the silicon oxide film formed has a target film thickness in a range of 4 nm to 10 nm and said first step forms a silicon oxide film by a film thickness in a range of 70% to 98% of the target film thickness, and said second step increases the film until reaching the target film thickness.

* * * * *